(12) United States Patent
Nasiri et al.

(10) Patent No.: US 8,508,039 B1
(45) Date of Patent: Aug. 13, 2013

(54) WAFER SCALE CHIP SCALE PACKAGING OF VERTICALLY INTEGRATED MEMS SENSORS WITH ELECTRONICS

(75) Inventors: Steven S. Nasiri, Saratoga, CA (US); Goksen G. Yaralioglu, Mountain View, CA (US)

(73) Assignee: Invensense, Inc., Sunnyvale, CA (US)

( * ) Notice: Subject to any disclaimer, the term of this patent is extended or adjusted under 35 U.S.C. 154(b) by 777 days.

(21) Appl. No.: 12/117,264

(22) Filed: May 8, 2008

(51) Int. Cl.
*H01L 23/12* (2006.01)

(52) U.S. Cl.
USPC .... 257/704; 257/678; 257/783; 257/E21.499; 438/66; 438/106; 438/125

(58) Field of Classification Search
USPC ...... 257/678, 783, 704, E21.499; 73/514.29; 438/66, 125
See application file for complete search history.

(56) References Cited

U.S. PATENT DOCUMENTS

| | | | |
|---|---|---|---|
| 4,303,978 A | 12/1981 | Shaw et al. |
| 4,510,802 A | 4/1985 | Peters |
| 4,601,206 A | 7/1986 | Watson |
| 4,736,629 A | 4/1988 | Cole |
| 4,783,742 A | 11/1988 | Peters |
| 4,841,773 A | 6/1989 | Stewart |
| 5,251,484 A | 10/1993 | Mastache |
| 5,313,835 A | 5/1994 | Dunn |
| 5,349,858 A | 9/1994 | Yagi et al. |
| 5,359,893 A | 11/1994 | Dunn |
| 5,367,631 A | 11/1994 | Levy |
| 5,415,040 A | 5/1995 | Nottmeyer |
| 5,433,110 A | 7/1995 | Gertz et al. |
| 5,440,326 A | 8/1995 | Quinn |
| 5,444,639 A | 8/1995 | White |
| 5,511,419 A | 4/1996 | Dunn |
| 5,541,860 A | 7/1996 | Takei et al. |
| 5,574,221 A | 11/1996 | Park et al. |
| 5,629,988 A | 5/1997 | Burt et al. |
| 5,635,638 A | 6/1997 | Geen |
| 5,635,639 A | 6/1997 | Greiff et al. |

(Continued)

FOREIGN PATENT DOCUMENTS

| EP | 0429391 | 8/1995 |
|---|---|---|
| GB | 2428802 | 2/2007 |

(Continued)

OTHER PUBLICATIONS

Oboe, R., Lasalandra, E., White, M. M. MEMS-based Accelerometers and their Application to Vibration Suppression in Hard Disk Drives. MEMS/NEMS Handbook Techniques and Applications vol. 4, Springer 2006, pp. 1-29 see pp. 7-22.

(Continued)

*Primary Examiner* — Eugene Lee
*Assistant Examiner* — Fang-Xing Jiang
(74) *Attorney, Agent, or Firm* — Sawyer Law Group, P.C.

(57) ABSTRACT

In a method and system in accordance with the present invention, solder balls are added on top of vertically integrated MEMS with CMOS by using wafer scale fabrication compatible with existing chip scale packaging capabilities. In the present invention, both the MEMS and the CMOS dies are fabricated in equal dimensions. On the MEMS level, silicon islands are defined by DRIE etching to be bonded on top of CMOS pads. These conducting silicon islands later provide electrical connections between the CMOS pads and the conducting traces that lead to solder balls on top.

21 Claims, 22 Drawing Sheets

U.S. PATENT DOCUMENTS

| | | | |
|---|---|---|---|
| 5,698,784 A | 12/1997 | Hotelling | |
| 5,703,293 A | 12/1997 | Zabler et al. | |
| 5,703,623 A | 12/1997 | Hall et al. | |
| 5,734,373 A | 3/1998 | Rosenberg et al. | |
| 5,780,740 A | 7/1998 | Lee et al. | |
| 5,825,350 A | 10/1998 | Case, Jr. | |
| 5,895,850 A | 4/1999 | Buestgens | |
| 5,898,421 A | 4/1999 | Quinn | |
| 5,955,668 A | 9/1999 | Hsu et al. | |
| 5,992,233 A | 11/1999 | Clark | |
| 5,996,409 A | 12/1999 | Funk et al. | |
| 6,067,858 A | 5/2000 | Clark et al. | |
| 6,122,961 A | 9/2000 | Geen et al. | |
| 6,134,961 A | 10/2000 | Touge et al. | |
| 6,158,280 A | 12/2000 | Nonomura | |
| 6,168,965 B1 * | 1/2001 | Malinovich et al. | 438/66 |
| 6,189,381 B1 | 2/2001 | Huang et al. | |
| 6,192,756 B1 | 2/2001 | Kikuchi et al. | |
| 6,230,564 B1 | 5/2001 | Matsunaga et al. | |
| 6,250,156 B1 | 6/2001 | Seshia et al. | |
| 6,250,157 B1 | 6/2001 | Touge | |
| 6,269,254 B1 | 7/2001 | Mathis | |
| 6,279,043 B1 | 8/2001 | Hayward et al. | |
| 6,292,170 B1 | 9/2001 | Chang et al. | |
| 6,343,349 B1 | 1/2002 | Braun et al. | |
| 6,370,937 B2 | 4/2002 | Hsu | |
| 6,374,255 B1 | 4/2002 | Peurach et al. | |
| 6,386,033 B1 | 5/2002 | Negoro | |
| 6,391,673 B1 | 5/2002 | Ha et al. | |
| 6,393,914 B1 | 5/2002 | Zarabadi et al. | |
| 6,424,356 B2 | 7/2002 | Chang et al. | |
| 6,429,895 B1 | 8/2002 | Onuki | |
| 6,430,998 B2 | 8/2002 | Kawai et al. | |
| 6,480,320 B2 | 11/2002 | Nasiri | |
| 6,481,283 B1 | 11/2002 | Cardarelli | |
| 6,481,284 B2 | 11/2002 | Geen et al. | |
| 6,481,285 B1 | 11/2002 | Shkel et al. | |
| 6,487,369 B1 | 11/2002 | Sato | |
| 6,487,908 B2 | 12/2002 | Geen et al. | |
| 6,494,096 B2 | 12/2002 | Sakai et al. | |
| 6,508,122 B1 | 1/2003 | McCall et al. | |
| 6,508,125 B2 | 1/2003 | Otani | |
| 6,513,380 B2 | 2/2003 | Reeds, III et al. | |
| 6,520,017 B1 | 2/2003 | Schoefthaler et al. | |
| 6,533,947 B2 | 3/2003 | Nasiri et al. | |
| 6,573,883 B1 | 6/2003 | Bartlett | |
| 6,636,521 B1 | 10/2003 | Guillianelli | |
| 6,646,289 B1 | 11/2003 | Badehi | |
| 6,647,352 B1 | 11/2003 | Horton | |
| 6,668,614 B2 | 12/2003 | Itakura | |
| 6,720,994 B1 | 4/2004 | Grottodden et al. | |
| 6,725,719 B2 | 4/2004 | Cardarelli | |
| 6,729,176 B2 | 5/2004 | Begin | |
| 6,758,093 B2 | 7/2004 | Tang et al. | |
| 6,794,272 B2 | 9/2004 | Turner et al. | |
| 6,796,178 B2 | 9/2004 | Jeong et al. | |
| 6,823,733 B2 | 11/2004 | Ichinose | |
| 6,834,249 B2 | 12/2004 | Orchard | |
| 6,843,127 B1 | 1/2005 | Chiou | |
| 6,845,669 B2 | 1/2005 | Acar et al. | |
| 6,848,304 B2 | 2/2005 | Geen | |
| 6,859,751 B2 | 2/2005 | Cardarelli | |
| 6,860,150 B2 | 3/2005 | Cho | |
| 6,892,575 B2 | 5/2005 | Nasiri et al. | |
| 6,915,693 B2 | 7/2005 | Kim et al. | |
| 6,918,297 B2 | 7/2005 | MacGugan | |
| 6,918,298 B2 | 7/2005 | Park | |
| 6,938,484 B2 | 9/2005 | Najafi et al. | |
| 6,939,473 B2 | 9/2005 | Nasiri et al. | |
| 6,952,965 B2 | 10/2005 | Kang et al. | |
| 6,955,086 B2 | 10/2005 | Yoshikawa et al. | |
| 6,963,345 B2 | 11/2005 | Boyd et al. | |
| 6,972,480 B2 | 12/2005 | Zilber et al. | |
| 6,981,416 B2 | 1/2006 | Chen et al. | |
| 7,004,025 B2 | 2/2006 | Tamura | |
| 7,028,546 B2 | 4/2006 | Hoshal | |
| 7,028,547 B2 | 4/2006 | Shiratori et al. | |
| 7,036,372 B2 | 5/2006 | Chojnacki et al. | |
| 7,040,163 B2 | 5/2006 | Shcheglov et al. | |
| 7,040,922 B2 | 5/2006 | Harney et al. | |
| 7,043,985 B2 | 5/2006 | Ayazi et al. | |
| 7,057,645 B1 | 6/2006 | Hara et al. | |
| 7,077,007 B2 | 7/2006 | Rich et al. | |
| 7,093,487 B2 | 8/2006 | Mochida | |
| 7,104,129 B2 | 9/2006 | Nasiri et al. | |
| 7,121,141 B2 | 10/2006 | McNeil | |
| 7,154,477 B1 | 12/2006 | Hotelling et al. | |
| 7,155,975 B2 | 1/2007 | Mitani et al. | |
| 7,158,118 B2 | 1/2007 | Liberty | |
| 7,159,442 B1 | 1/2007 | Jean | |
| 7,168,317 B2 | 1/2007 | Chen | |
| 7,180,500 B2 | 2/2007 | Marvit et al. | |
| 7,196,404 B2 | 3/2007 | Schirmer et al. | |
| 7,210,351 B2 | 5/2007 | Lo et al. | |
| 7,222,533 B2 | 5/2007 | Mao et al. | |
| 7,236,156 B2 | 6/2007 | Liberty et al. | |
| 7,237,437 B1 | 7/2007 | Fedora | |
| 7,239,301 B2 | 7/2007 | Liberty et al. | |
| 7,240,552 B2 | 7/2007 | Acar et al. | |
| 7,243,561 B2 | 7/2007 | Ishigami et al. | |
| 7,247,246 B2 | 7/2007 | Nasiri et al. | |
| 7,250,112 B2 | 7/2007 | Nasiri et al. | |
| 7,258,008 B2 | 8/2007 | Durante et al. | |
| 7,258,011 B2 | 8/2007 | Nasiri et al. | |
| 7,260,789 B2 | 8/2007 | Hunleth et al. | |
| 7,262,760 B2 | 8/2007 | Liberty | |
| 7,284,430 B2 | 10/2007 | Acar et al. | |
| 7,289,898 B2 | 10/2007 | Hong et al. | |
| 7,290,435 B2 | 11/2007 | Seeger et al. | |
| 7,299,695 B2 | 11/2007 | Tanaka et al. | |
| 7,325,454 B2 | 2/2008 | Saito et al. | |
| 7,331,212 B2 | 2/2008 | Manlove et al. | |
| 7,333,087 B2 | 2/2008 | Soh et al. | |
| 7,352,567 B2 | 4/2008 | Hotelling et al. | |
| 7,377,167 B2 | 5/2008 | Acar et al. | |
| 7,386,806 B2 | 6/2008 | Wroblewski | |
| 7,395,181 B2 | 7/2008 | Foxlin | |
| 7,414,611 B2 | 8/2008 | Liberty | |
| 7,424,213 B2 | 9/2008 | Imada | |
| 7,437,931 B2 | 10/2008 | Dwyer et al. | |
| 7,442,570 B2 | 10/2008 | Nasiri et al. | |
| 7,454,971 B2 | 11/2008 | Blomqvist | |
| 7,458,263 B2 | 12/2008 | Nasiri et al. | |
| 7,508,384 B2 | 3/2009 | Zhang et al. | |
| 7,522,947 B2 | 4/2009 | Tsuda | |
| 7,533,569 B2 | 5/2009 | Sheynblat | |
| 7,549,335 B2 | 6/2009 | Inoue et al. | |
| 7,552,636 B2 | 6/2009 | Datskos | |
| 7,617,728 B2 | 11/2009 | Cardarelli | |
| 7,621,183 B2 | 11/2009 | Seeger et al. | |
| 7,637,155 B2 | 12/2009 | Delevoye | |
| 7,677,099 B2 | 3/2010 | Nasiri et al. | |
| 7,677,100 B2 | 3/2010 | Konaka | |
| 7,688,306 B2 | 3/2010 | Wehrenberg et al. | |
| 7,732,302 B2 | 6/2010 | Yazdi | |
| 7,765,869 B2 | 8/2010 | Sung et al. | |
| 7,779,689 B2 | 8/2010 | Li et al. | |
| 7,783,392 B2 | 8/2010 | Oikawa | |
| 7,784,344 B2 | 8/2010 | Pavelescu et al. | |
| 7,795,074 B2 * | 9/2010 | Shao et al. | 438/106 |
| 7,814,791 B2 | 10/2010 | Andersson et al. | |
| 7,814,792 B2 | 10/2010 | Tateyama et al. | |
| 7,886,597 B2 | 2/2011 | Uchiyama et al. | |
| 7,907,838 B2 | 3/2011 | Nasiri et al. | |
| 7,970,586 B1 | 6/2011 | Kahn et al. | |
| 8,018,435 B2 | 9/2011 | Orchard et al. | |
| 8,020,441 B2 | 9/2011 | Seeger | |
| 8,141,424 B2 | 3/2012 | Seeger et al. | |
| 8,230,740 B2 | 7/2012 | Katsuki et al. | |
| 2002/0027296 A1 * | 3/2002 | Badehi | 257/783 |
| 2002/0189351 A1 | 12/2002 | Reeds et al. | |
| 2003/0159511 A1 | 8/2003 | Zarabadi et al. | |
| 2003/0209789 A1 | 11/2003 | Hanson et al. | |
| 2004/0016995 A1 * | 1/2004 | Kuo et al. | 257/678 |
| 2004/0066981 A1 | 4/2004 | Li et al. | |
| 2004/0160525 A1 | 8/2004 | Kingetsu et al. | |
| 2004/0179108 A1 | 9/2004 | Sorek et al. | |

| | | |
|---|---|---|
| 2005/0066728 A1 | 3/2005 | Chojnacki |
| 2005/0081633 A1* | 4/2005 | Nasiri et al. ............... 73/514.29 |
| 2005/0110778 A1 | 5/2005 | Ayed |
| 2005/0170656 A1 | 8/2005 | Nasiri et al. |
| 2005/0212751 A1 | 9/2005 | Marvit et al. |
| 2006/0017837 A1 | 1/2006 | Sorek et al. |
| 2006/0032308 A1 | 2/2006 | Acar et al. |
| 2006/0033823 A1 | 2/2006 | Okamura |
| 2006/0061545 A1 | 3/2006 | Hughes et al. |
| 2006/0074558 A1 | 4/2006 | Williamson et al. |
| 2006/0115297 A1 | 6/2006 | Nakamaru |
| 2006/0119710 A1 | 6/2006 | Ben-Ezra et al. |
| 2006/0139327 A1 | 6/2006 | Dawson et al. |
| 2006/0164382 A1 | 7/2006 | Kulas et al. |
| 2006/0164385 A1 | 7/2006 | Smith et al. |
| 2006/0185502 A1 | 8/2006 | Nishitani et al. |
| 2006/0187308 A1 | 8/2006 | Lim et al. |
| 2006/0208326 A1 | 9/2006 | Nasiri et al. |
| 2006/0251410 A1 | 11/2006 | Trutna, Jr. |
| 2006/0256074 A1 | 11/2006 | Krum et al. |
| 2007/0035630 A1 | 2/2007 | Lindenstruth et al. |
| 2007/0055468 A1 | 3/2007 | Pylvanainen |
| 2007/0063985 A1 | 3/2007 | Yamazaki et al. |
| 2007/0113207 A1 | 5/2007 | Gritton |
| 2007/0123282 A1 | 5/2007 | Levinson |
| 2007/0146325 A1 | 6/2007 | Poston et al. |
| 2007/0167199 A1 | 7/2007 | Kang |
| 2007/0176898 A1 | 8/2007 | Suh |
| 2007/0219744 A1 | 9/2007 | Kolen |
| 2007/0239399 A1 | 10/2007 | Sheynblat et al. |
| 2007/0277112 A1 | 11/2007 | Rossler et al. |
| 2008/0009348 A1 | 1/2008 | Zalewski et al. |
| 2008/0088602 A1 | 4/2008 | Hotelling |
| 2008/0098315 A1 | 4/2008 | Chou et al. |
| 2008/0134784 A1 | 6/2008 | Jeng et al. |
| 2008/0158154 A1 | 7/2008 | Liberty et al. |
| 2008/0204566 A1 | 8/2008 | Yamazaki et al. |
| 2008/0314147 A1 | 12/2008 | Nasiri et al. |
| 2009/0005975 A1 | 1/2009 | Forstall et al. |
| 2009/0005986 A1 | 1/2009 | Soehren |
| 2009/0007661 A1 | 1/2009 | Nasiri et al. |
| 2009/0043504 A1 | 2/2009 | Bandyopadhyay et al. |
| 2009/0088204 A1 | 4/2009 | Culbert et al. |
| 2009/0282917 A1 | 11/2009 | Acar |
| 2009/0326851 A1 | 12/2009 | Tanenhaus |
| 2010/0013814 A1 | 1/2010 | Jarczyk |
| 2011/0101474 A1 | 5/2011 | Funk |

FOREIGN PATENT DOCUMENTS

| | | |
|---|---|---|
| JP | 06-291725 | 10/1994 |
| JP | 2001-174283 | 6/2001 |
| JP | 2004-517306 | 6/2004 |
| JP | 2005-233701 | 9/2005 |
| JP | 2005-283428 | 10/2005 |
| JP | 2005-345473 | 12/2005 |
| JP | 2006-275660 | 10/2006 |
| JP | 2007-173641 | 7/2007 |
| JP | 2008-003182 | 1/2008 |
| JP | 2008-520985 | 6/2008 |
| WO | WO 20061043890 | 4/2006 |
| WO | WO 20081026357 | 3/2008 |
| WO | WO 20091016607 | 2/2009 |

OTHER PUBLICATIONS

Singh, Amit, "The Apple Motion Sensor as a Human Interface Device," www.kernelthread.com, 1994-2006.

Cho, et al., Dynamics of Tilt-based Browsing on Mobile Devices. CHI 2007, Apr. 28-May 3, 2007, San Jose, California, USA., pp. 1947-1952.

Roberto Oboe, et al., "MEMS—based Accelerometers and their Application to Vibration Suppression in Hard Dish Drives," MEMS/NEMS Handbook Techniques and Application, vol. 4, Springer 2006, pp. 7-22, Dec. 31, 2006.

Liu Jun, et al., "Study on Single Chip Integration Accelerometer Gyroscope," Journal of Test and Measurement Technology, vol. 17, Issue 2, pp. 157-158, Dec. 31, 2003.

* cited by examiner

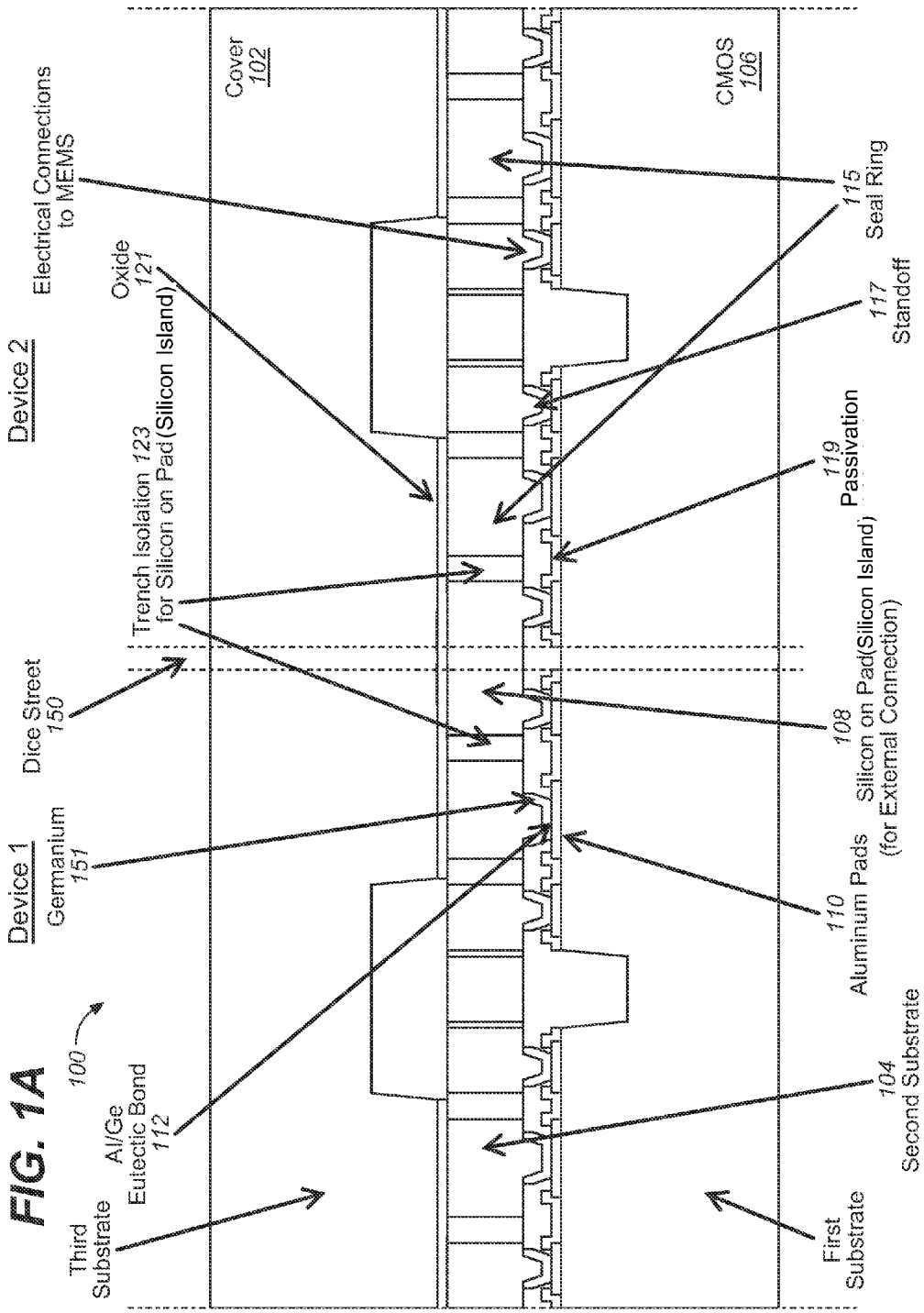

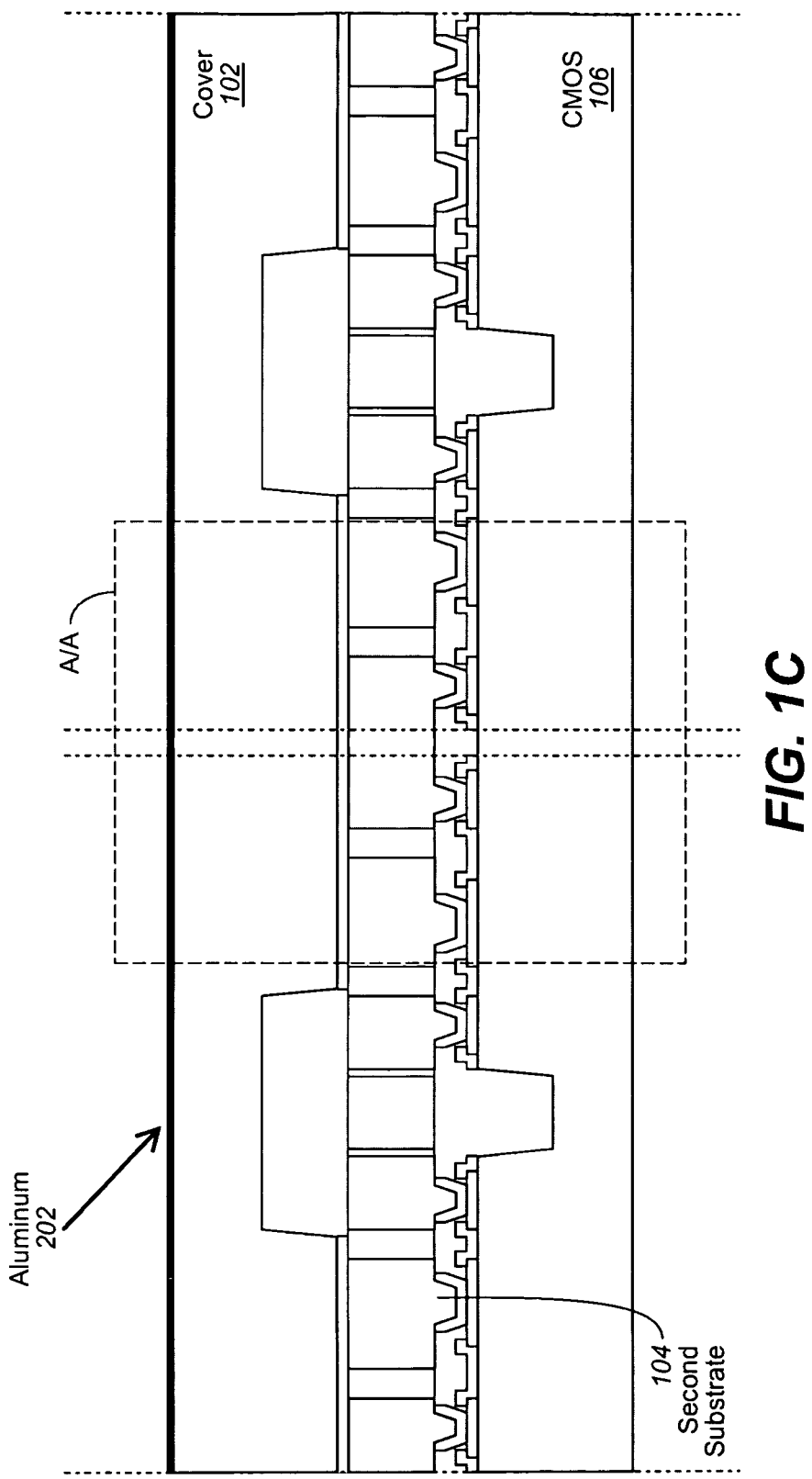

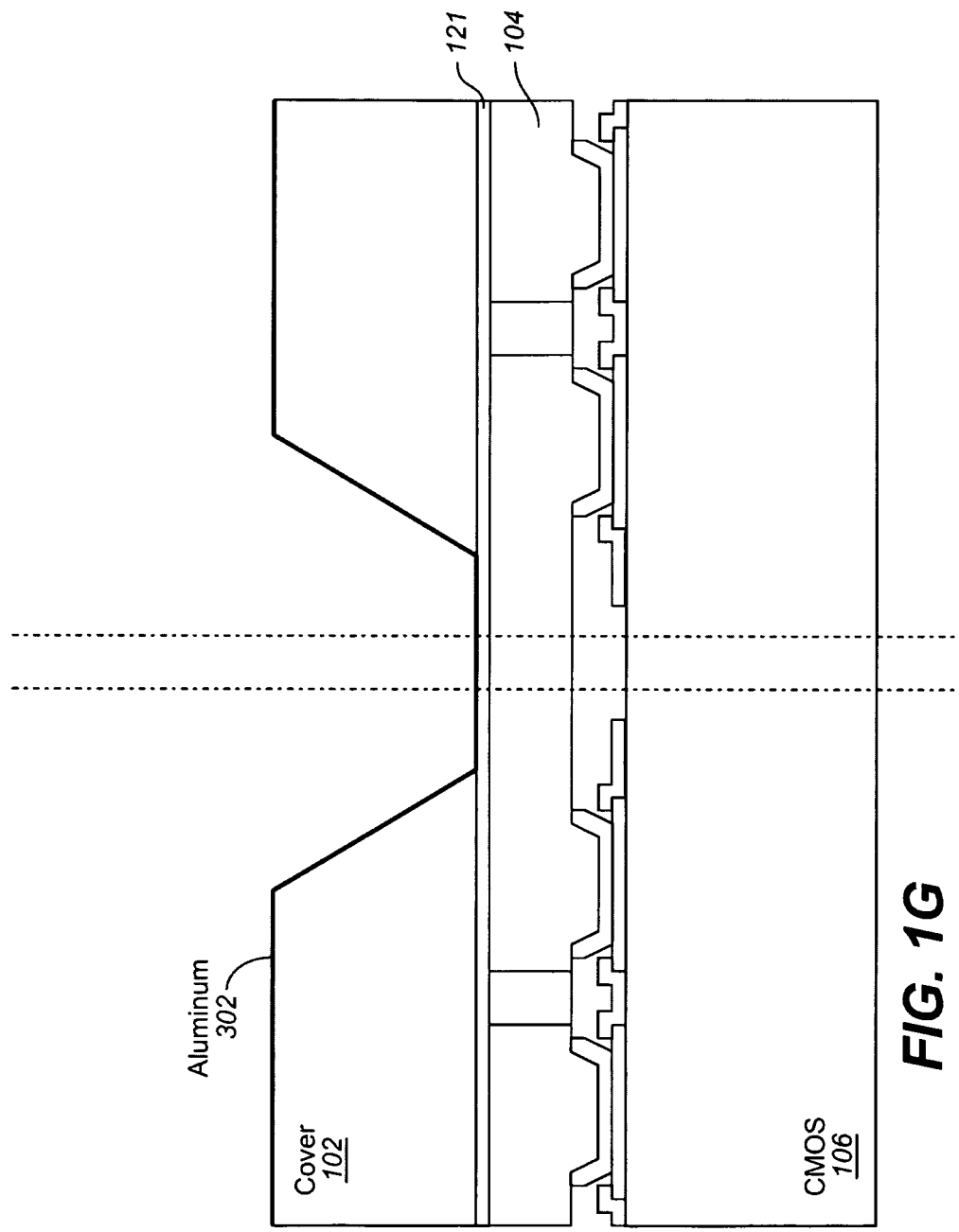

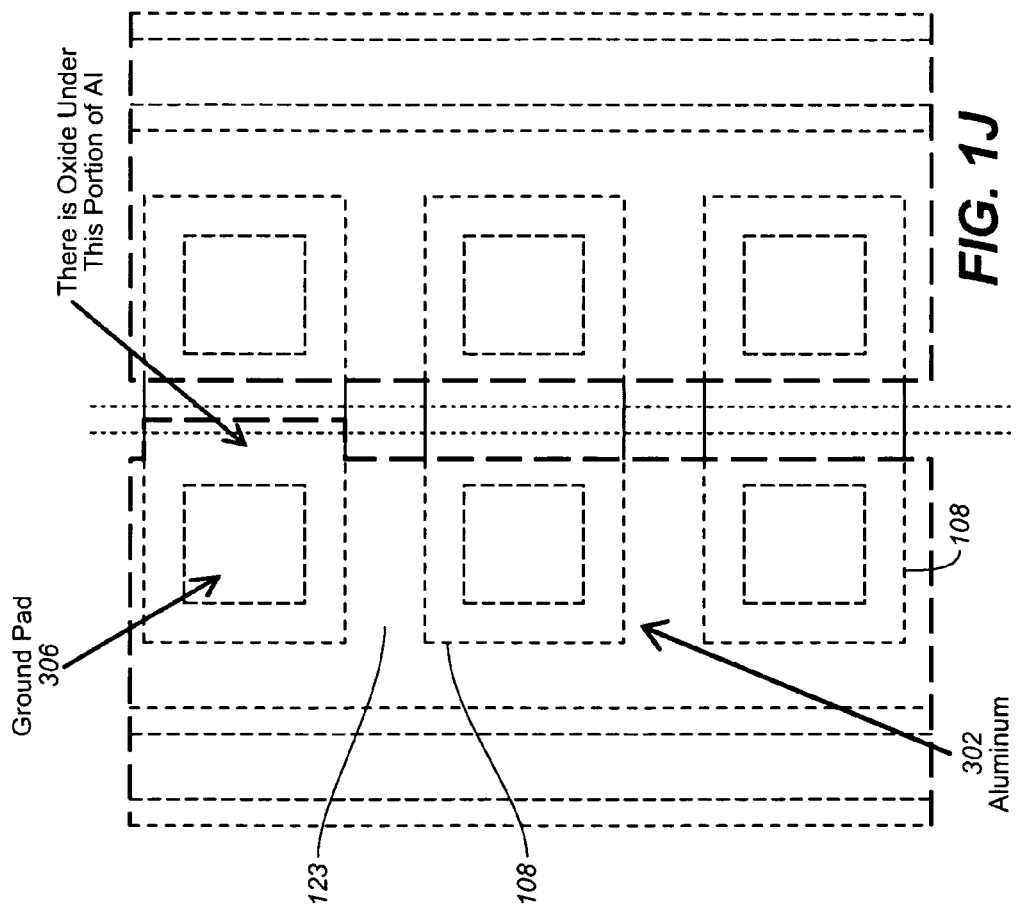

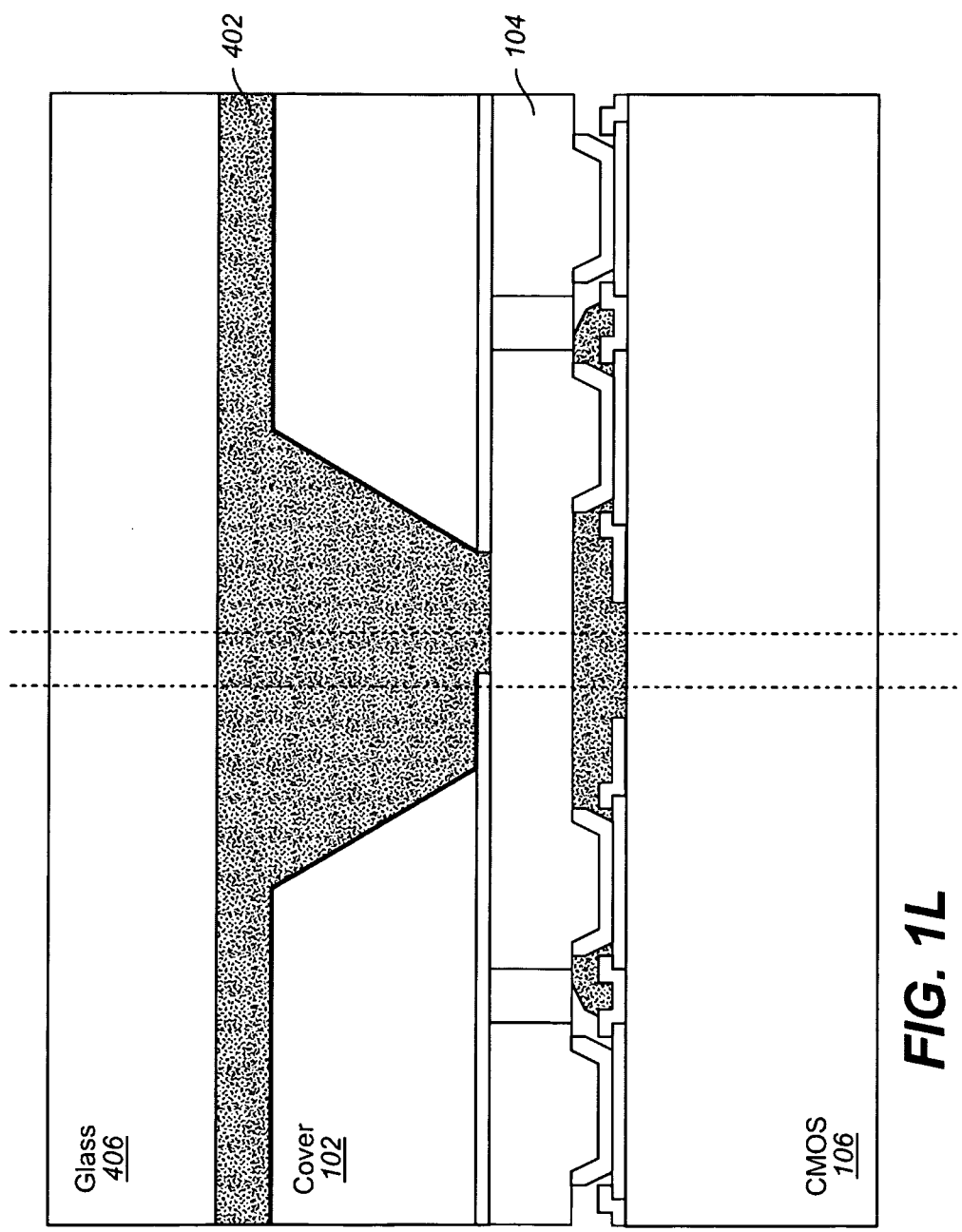

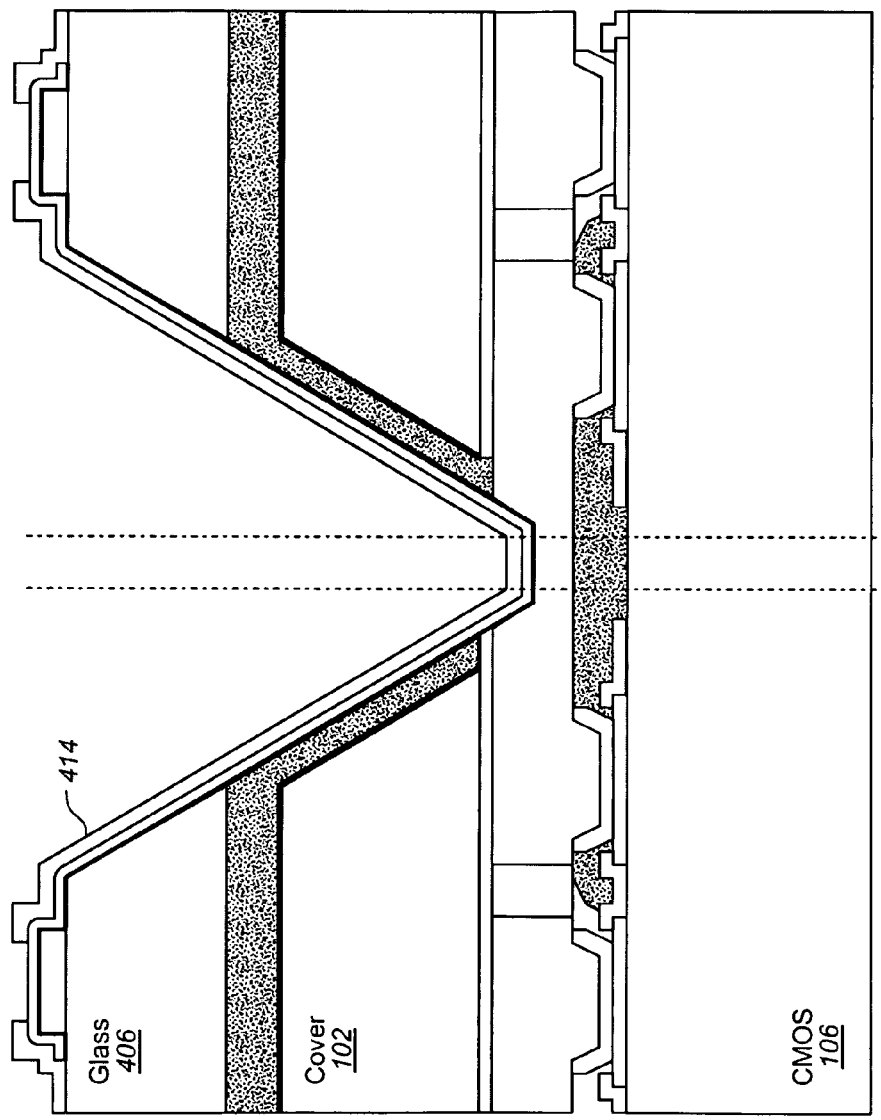

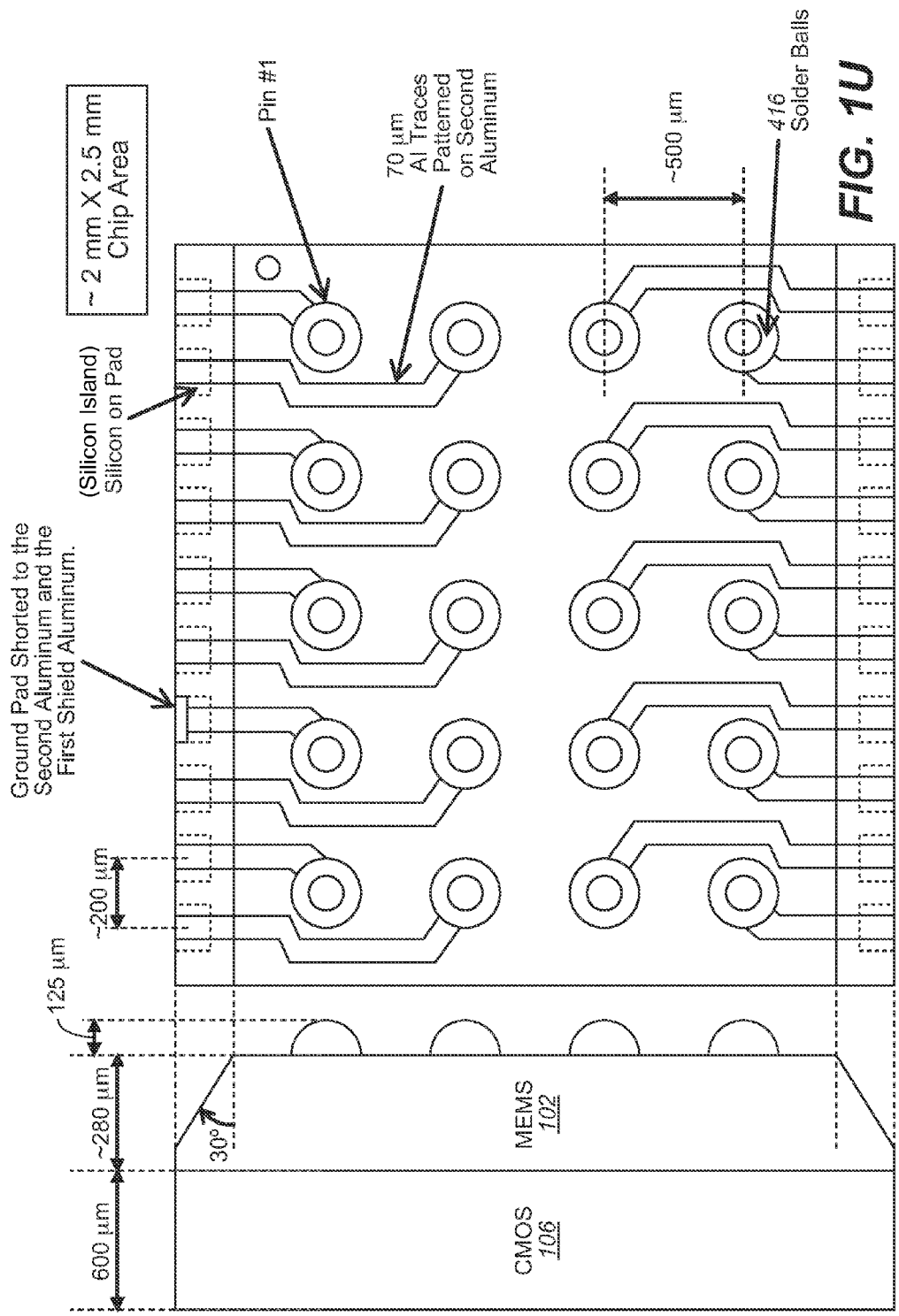

WAFER SCALE CHIP SCALE PACKAGING OF VERTICALLY INTEGRATED MEMS SENSORS WITH ELECTRONICS

FIELD OF THE INVENTION

The present invention relates generally to sensors and more particularly to MEMS sensors utilized with electronics.

BACKGROUND OF THE INVENTION

Packaging for microelectronics and MEMS are one of the most important production steps before bringing the product into the market. Various packaging technologies have been developed for integrated circuits and MEMS. Initial MEMS devices used the technologies developed by IC industry. On the other hand, advances in the MEMS technologies offer a tremendous contribution to microelectronic integration and packaging. Historically, all the newly introduced packaging technologies enabled lower footprint and lower cost. Chip scale packaging (CSP) is the latest development where the final footprint of the device is fundamentally determined by the active die itself.

CSP for ICs

The term chip scale package was first introduced in 1994. It is defined as a package that has an area which is no more than 1.2 times the area of the active die. CSPs offer many advantages such as smaller size, lesser weight, relatively easier assembly process, lower cost, improved electrical performance due to lower parasitics. Chip scale packaging combines the strengths of various packaging technologies. For example, it offers the size and performance advantage of bare die attachment and the reliability of encapsulated devices. The significant size and weight reduction makes the CSP ideal for use in portable devices like cell phones, laptops, pocket computers, and digital cameras.

Various CSP technologies have been developed by different companies. These can be grouped under four major categories according to CSP structure:

1. Rigid interposer type. The die is flip-chip attached to a rigid printed circuit board (PCB) fabricated using advanced technologies that can accommodate the pitch and clearance requirements of the die. The interposer translates the die pad pitch into a rather large interconnect pitch. Mini BGA (IBM), Small Form (LSI logic), Flip chip BGA (Sony) are some of the package names used by different companies.

2. Flexible interposer type. This type is very similar to the first type except the material used for the interposer. Common materials for the interposer are liquid-crystal polymer and polyimide. Some of the package names are chip on flex (GE), fine pitch BGA (Nec), F. GBA (Sharp).

3. Custom lead frame type. In this type, frame leads are directly attached to the die pads. Small outline non-lead (Fujitsu), Lead on chip (Hitachi), Bottom lead package (LG) are some of the package names introduced by various companies.

4. Wafer-level assembly type (Wafer Level Chip Scale Package) (WLCSP). This type of package is substantially or completely constructed before the wafers are sawed into dies. Obviously, packaging the ICs at the same IC manufacturing site has many economic advantages. It eliminates wafer probing tests since these can now be achieved at the part level. It reduces or eliminates the costs associated with individual packaging of the parts like shipping the wafer overseas for packaging. And finally, it provides manufacturers the complete control over IC production. The next section will discuss the WLCSP in more detail below.

Wafer Level Chip Scale Packaging for ICs

Wafer level Chip Scale Packaging is the latest packaging technology. This technology comes in a variety of types. There are basically four different Wafer Level Chip Scale Packaging technology classifications.

1. Redistribution layer and bump technology. This is the most widely used technology. In this technology, first the IC surface is repassivated by one or more layers of a photo patternable polymer such as BCB (benzocyclobutene). This later provides protection for the die from external environment. It also allows multiple metal traces for routing between the solder bumps and the IC pads. Next, the redistribution layer is defined through sputtered and evaporated metals followed by a lift-off process. This layer can also be defined by electroplating. Finally, solder bumps are formed using electroplating on a UBM stack on the redistribution layer.

2. Encapsulated copper post technology. This is very similar to the redistribution and bump technology except that the redistribution layer routes the connections from IC pads to copper posts defined by sputtering/etching or electroplating techniques. After defining the copper posts, the IC surface is encapsulated in low stress epoxy by transfer molding. The epoxy coating leaves the top portions of the copper posts exposed. Later, standard solder bumping process is applied to solder balls on top of these posts.

3. Encapsulated wire bond. Similar to the two previous techniques, a redistribution layer is used to increase the IO pitch to the desired level. Then, S-shaped gold wires are placed on the redistribution pads using a modified wire bonder. These wires are later soldered to the PCB during the assembly.

4. Encapsulated beam technology. The packaging process starts by attaching a glass plate to the IC by means of an adhesive layer such that the active surface of the CMOS faces the glass plate. The CMOS is diced into dies by using either chemical etching or mechanical cutting while the die is attached to the glass plate. Then, the second glass plate is attached on top by another adhesive layer, preferably epoxy, filling the dice channels. Wafer sawing the second plate and CMOS reveals the edges of the IC pads. The routes between these conducting edges and the solder balls that will be placed on the second plate are defined by metal sputtering, patterning and etching. In this approach, the solder balls are placed on the back side of the CMOS. This packaging method provides a clear view for the active CMOS surface where an image sensor or a light detector can be placed. With slight variations in the packaging process, solder balls can be placed on the top side of the CMOS.

Packaging for MEMS

Packing requirements for MEMS are much more complex than IC packaging requirements. For example, optical sensors require transparent packaging such that the package does not attenuate the optical signals. On the other hand, an acoustic sensor needs to be accessible from outside through a finely engineered opening that allows maximum transmission of sound waves while blocking dust and wind. MEMS inertial sensors require hermetic sealing. Therefore, packaging of MEMS devices reveals itself in many novel designs and techniques.

The simplest approach to package a MEMS device is to place the sensor in a housing and provide electrical connections through wire bonding between the leads of the housing and the MEMS die. The housing should protect the moving parts from environmental effect such as humidity and dust. Hermetical or non-hermetical packages can be used for these purposes. Typical housing materials are metal, plastic or ceramics. However, this approach results in relatively large footprints and these packages are not suitable for the consumer applications where reduction in size is very desirable. Moreover, for MEMS devices that require low pressure this approach is not practical.

Wafer Level packaging for MEMS

Above problems can be partially or completely solved by achieving some part of the packaging at the wafer level. Various techniques have been proposed for wafer level packaging of MEMS devices. For example, a silicon cap bonded at the wafer level has been used to provide triple-level polysilicon surface micromachined accelerometer. Low temperature glass frits have been used to achieve the bonding. The cap provides mechanical protection for the accelerometer such that the sensor can be later packaged in a conventional injection molded plastic package. VTI technologies from Finland use triple-stack anodic bonding for their commercial accelerometers. Three wafers are bonded together to form a hermetically sealed cavity at the center. The seismic mass is defined in the center wafer. Upper and lower wafers have a thin glass layer on their surfaces. The glass layers provide the anodic bonding. There are also other similar wafer level packaging technologies developed to companies such as ST, Bosch and ADI. But none of these achieves both packaging of MEMS and integration with CMOS electronics at the same time. The connections between the MEMS and CMOS are enabled through wire bonding. This results in increased cost. The most successful packaging and integration method for MEMS has been introduced by Nasiri et al. in U.S. Pat. Nos. 6,939,473 and 7,104,129 (hereinafter, the Nasiri-fabrication process). The Nasiri-fabrication process includes a special SOI wafer where recesses formed in the handle layer. The MEMS device is defined in the device layer using DRIE. Then, the SOI wafer with the device definition is bonded directly to the aluminum layer on the CMOS wafer, without addition of any other material layers on top of the aluminum. The bonding is performed at low temperature using eutectic metals. In one bonding step, the Nasiri-Fabrication provides for a wafer-scale integration, by making electrical interconnects between the MEMS and CMOS, and wafer-scale packaging by providing a fully hermetic sealing of the sensitive MEMS structures at the same time. The finished wafer then goes through yet another patented and proprietary pad opening step that uses a standard saving technique to remove unneeded MEMS silicon that covers electrical pads. Finished wafer are then tested on standard automated wafer probers. The subsequent packaging can readily be completed cost effectively in plastic packages at any industry standard contract assembly house, avoiding the need for more costly and customized ceramic and/or multichip packaging alternatives.

Although the Nasiri fabrication platform successfully addresses the most of the packaging needs of the consumer products, emerging applications and portable products are demanding further miniaturization of MEMS sensors. Portable electronic devices are getting smaller and more feature rich. This requires further size reductions for MEMS sensor ICs in height. The key requirement for portable electronics, especially for handsets, is a maximum of 1 mm device height which is difficult to achieve using plastic or ceramic packages for MEMS. In today's mobile handset market the trend is to provide high performance, low cost components with integration of functionality and small form factor. Wafer scale chip scale packaging provides smaller and very cost effective devices for these applications. Therefore, it is the technology of choice for handset market.

Wafer Level Chip Scale Packaging for MEMS

Wafer Level Chip Scale Packaging technologies can also be applied to the MEMS devices. For this purpose, various techniques have been developed. Shiv et al, in "Wafer Level Chip Scale Packaging for MEMS," developed a cap wafer with micro vias and Au/Sn seal ring that will provide eutectic bond to the MEMS/CMOS wafer. The process starts with an SOI wafer. The cavity and the vias are defined in the device layer. Later the device layer is covered by a passivation layer (oxide). The seal ring and micro vias are coated by electroplated Au/Sn solder. The cap wafer is then soldered to the MEMS/CMOS wafer. The cap wafer is etched from the handle side to provide access to the micro vias. This opens the ends of the vias. The solder balls that are placed on the back side of the cap are connected to the open ends of the vias. This approach has some draw backs. The cavity in the cap wafer can not be too deep. This limits the use of this method mostly to the surface micromachined devices. Also the cap height can not be made too high since the solder balls need to be placed on this side. In addition, this technique does not address the stress issues due to the different thermal expansion coefficients of PCB and silicon.

At Philips, there has been development effort for Wafer Level Chip Scale Packaging for their RF-MEMS components. In this approach, the MEMS devices are capped by another thin silicon piece which has solder on it. However, the capping is not done at wafer level, rather chip-to-chip solder bonding is used. Later solder balls are placed on the MEMS wafer. Although, the solder bumping is done at the wafer level, this approach is not true wafer level chip scale packaging. Therefore, it results in increased manufacturing cost. Moreover, the cap and the solder balls are on the same side of the wafer. This imposes limits on the solder size and cap size.

Fraunhofer IZM has also developed a Wafer Level Chip Scale Packaging technology. First, the cavities are defined on the cap wafer. Then seal rings are defined by depositing solder on the wafer. The cap wafer and the MEMS/CMOS wafer are aligned together under an IR aligner. The sandwiched wafer is brought into a reflow oven for soldering. After the soldering, back side grinding is performed to reduce total package height. The pads on the MEMS/CMOS wafer are exposed either by a pre-structured cap wafer or controlled dicing of the cap wafer without damaging the MEMS/CMOS wafer. The connections between the device pads and the solder balls are achieved by wire bonding from the pads to the top of the cap. Later, the wire bonds are covered with a liquid encapsulant and the dies are singulated using a wafer saw. Although this technology uses mature techniques, it has some drawbacks. For example, wire bonding limits the minimum distance between the dies resulting in increased footprint. Moreover, it is suitable only in surface micromachined devices.

Shellcase uses WLCSP for ICs as well as optic components. Their packaging technology is also suitable for MEMS devices. In this approach, first cavities are defined in SU8 layer deposited on a packaging substrate. The channels between the SU8 cavities are filled with epoxy. These epoxy filled channels are aligned over the MEMS/CMOS pads and the two substrates are brought together under pressure. After the epoxy is cured, the MEMS/CMOS wafer is etched from the back side, until the device pads are exposed. At the end of this step, the MEMS/CMOS dies are also singulated. A second packaging substrate is glued on the back side of the CMOS. The second substrate and the MEMS/CMOS die are then sawed by a wafer saw such that the edges of the pads are exposed close to the bottom of the cavities. Later, metal deposition makes contacts between these edges and the solder balls on the top of the second substrate. The major drawback of this approach is that it cannot provide a true hermetic seal for MEMS. Moreover, it is only applicable for surface micromachined devices.

None of the above technologies can address the wafer level chip size packaging need for bulk micromachined integrated MEMS with electronics while keeping the size small at reduced cost. The present invention addresses such as need.

SUMMARY OF THE INVENTION

In a method and system in accordance with the present invention, solder balls are added on top of vertically integrated MEMS with CMOS by using wafer scale fabrication compatible with existing chip scale packaging capabilities. In the present invention, both the MEMS and the CMOS dies are fabricated in equal dimensions. On the MEMS level, silicon islands are defined by DRIE etching to be bonded on top of CMOS pads. These conducting silicon islands later provide electrical connections between the CMOS pads and the conducting traces that lead to solder balls on top. Getting the electrical connections to the MEMS level from CMOS level eliminates the need for tab removal which is required for exposing pads. The key ideas differentiating this patent from the previous Wafer Level Chip Scale Packaging methods are summarized below:

1. Using conducting silicon islands over CMOS pads to provide electrical connections on the MEMS level. This simplifies the fabrication process.

2. The epoxy filling around the silicon islands over the CMOS pads. This enables further ruggedness to the fabricated devices.

3. Achieving true hermetic sealing during the wafer level packaging for MEMS.

4. The final device size is truly determined by the CMOS size.

5. Completely compatible with existing fabrication techniques and make use of minimum allowable dicing street dimensions.

BRIEF DESCRIPTION OF DRAWINGS

FIG. 1A shows the cross section of vertically integrated MEMS with CMOS fabricated according to the Nasiri fabrication process.

FIG. 1C shows an optional aluminum deposition step.

FIG. 1G depicts the first aluminum deposition.

FIG. 1J shows the top view after oxide etching.

FIG. 1L shows glass layer bonding.

FIG. 1O shows the second aluminum deposition making the ground connection.

FIG. 1S shows the solder mask patterning.

FIG. 1U shows the wafer sawing to singulate the devices.

DETAILED DESCRIPTION OF PREFERRED EMBODIMENTS

Figure 1B:
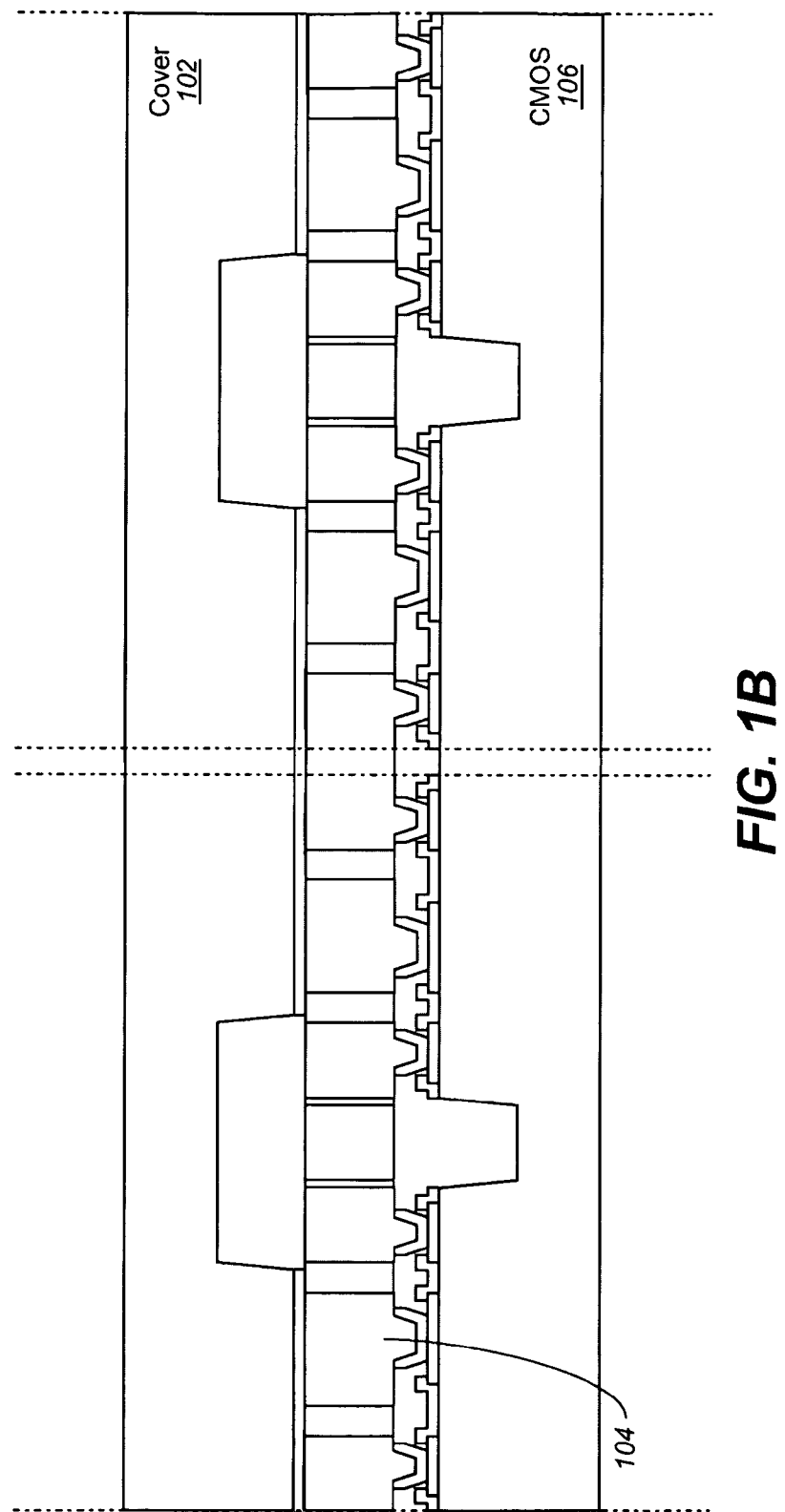
FIG. 1B shows the chip scale fabrication process starting with wafer thinning.

The present invention relates generally to sensors and more particularly to MEMS sensors utilized with electronics. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

The following describes the fabrication process for Wafer Level Chip Scale Packaging for Nasiri fabrication platform.

FIG. 1A shows the cross section of vertically integrated MEMS with CMOS structures 100 fabricated in accordance with the method described by Nasiri et al. The structure 100 includes three layers, a MEMS cover 102, an actuator (MEMS) layer 104 and a CMOS substrate 106. The actuator layer 104 is bonded to the cover 102 by fusion bonding and it is bonded to the CMOS substrate 106 by eutectic Al/Ge bond 112. The structure 100 includes silicon islands 108 bonded on CMOS pads 110 by Al/Germanium alloy 112 for the electrical connection between the CMOS pads 110 and solder balls (not shown). To describe the chip scale fabrication techniques, refer now to the following description in conjunction with the accompanying Figures.

Step 1. Wafer thinning. The chip scale fabrication process starts with wafer thinning as shown in FIG. 1B. The MEMS cover 102 is thinned down to preferably 150 microns. CMOS substrate 106 thinning is optional depending on the final height requirement.

Step 2. Aluminum deposition (optional). FIG. 1C shows an aluminum deposition step. This step can also be performed after DRIE etching of MEMS cover 102. Depending on when the deposition is done, the area of the ground shield changes. For the rest of the fabrication steps, the aluminum deposition 202 is assumed to be done after the DRIE step.

Figure 1D:
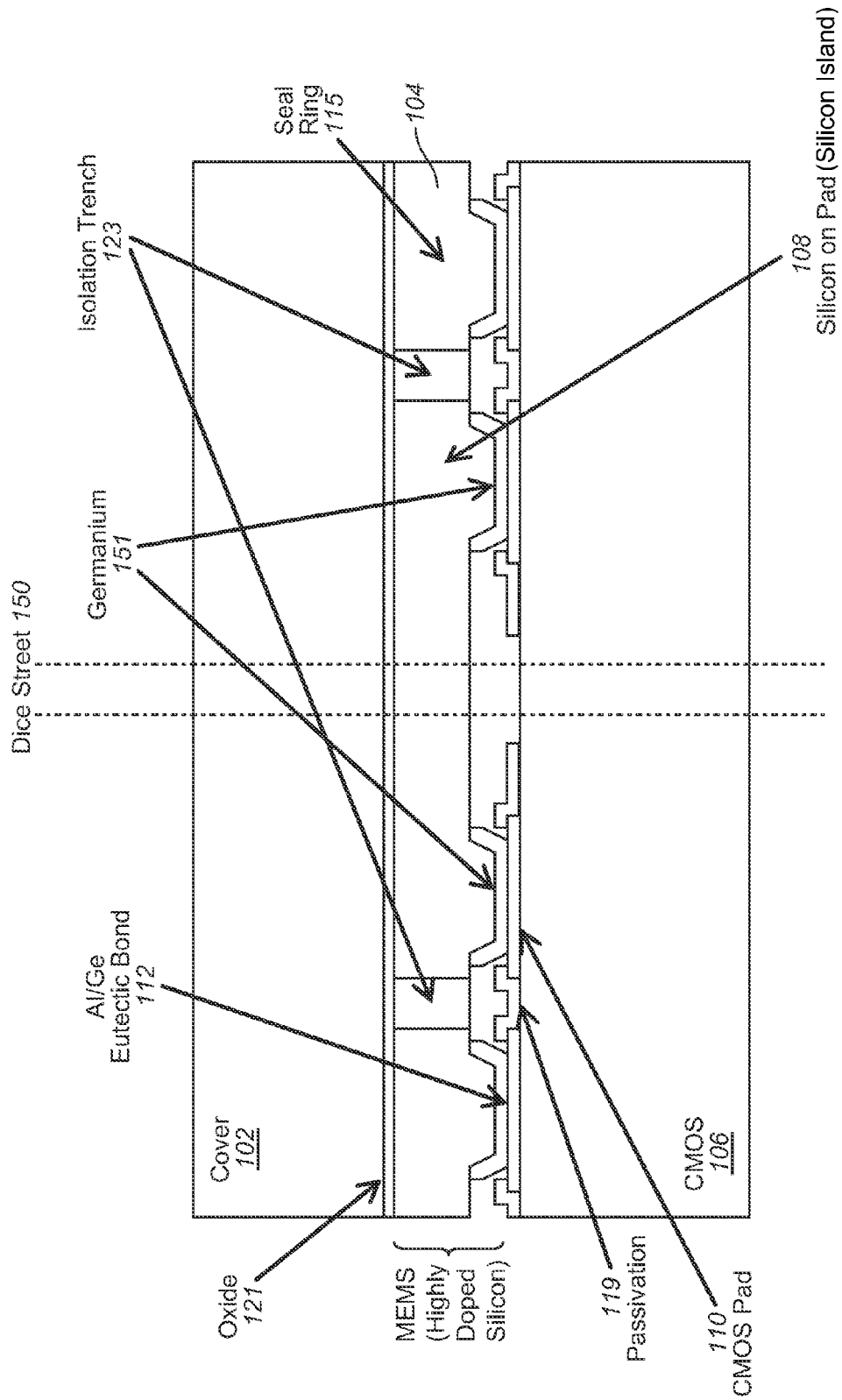
FIG. 1D shows a detailed picture of the silicon pads and the seal ring.

FIG. 1D shows a detailed picture of the CMOS pads 110 and the seal ring 115. Initially, the silicon on pads 108 are shared between the neighboring parts forming a bridge over the dice channels 150. As the rest of the actuator layer 104, the pads 108 are fusion bonded to the MEMS cover 102 and eventually bonded to the CMOS pads 110. A passivation layer 119 covers the CMOS area except on the pad openings and dice street 150.

Figure 1E:
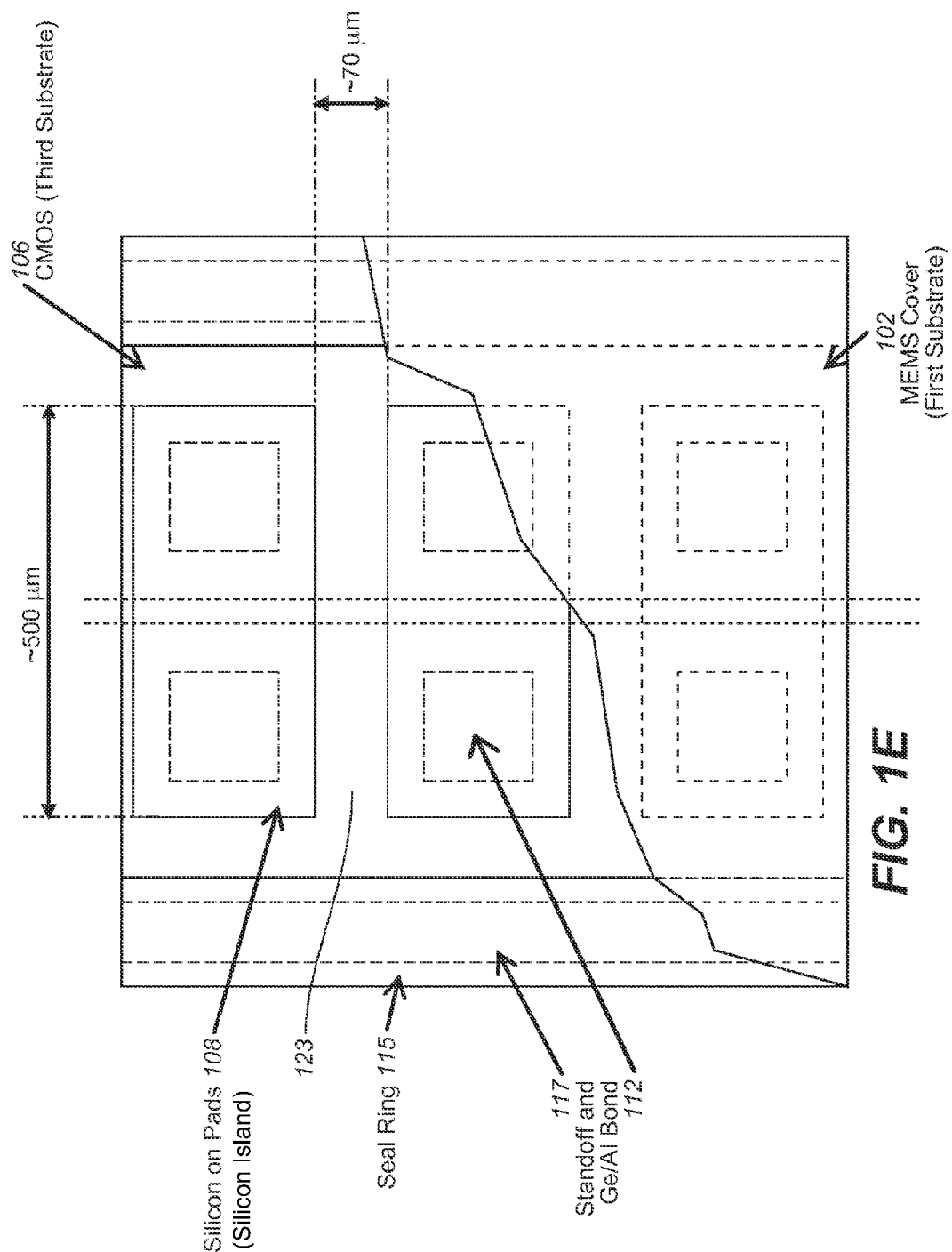
FIG. 1E shows the top view of the structure.

The top view of the structure is depicted in FIG. 1E. The silicon on pads 108 are electrically isolated from the rest of the actuator layer 104 by removing the silicon during the actuator layer definition and by forming isolation channels 123 as shown in the figure. Actuator layer definition is described, for example, in the Nasiri fabrication process.

Figure 1F:
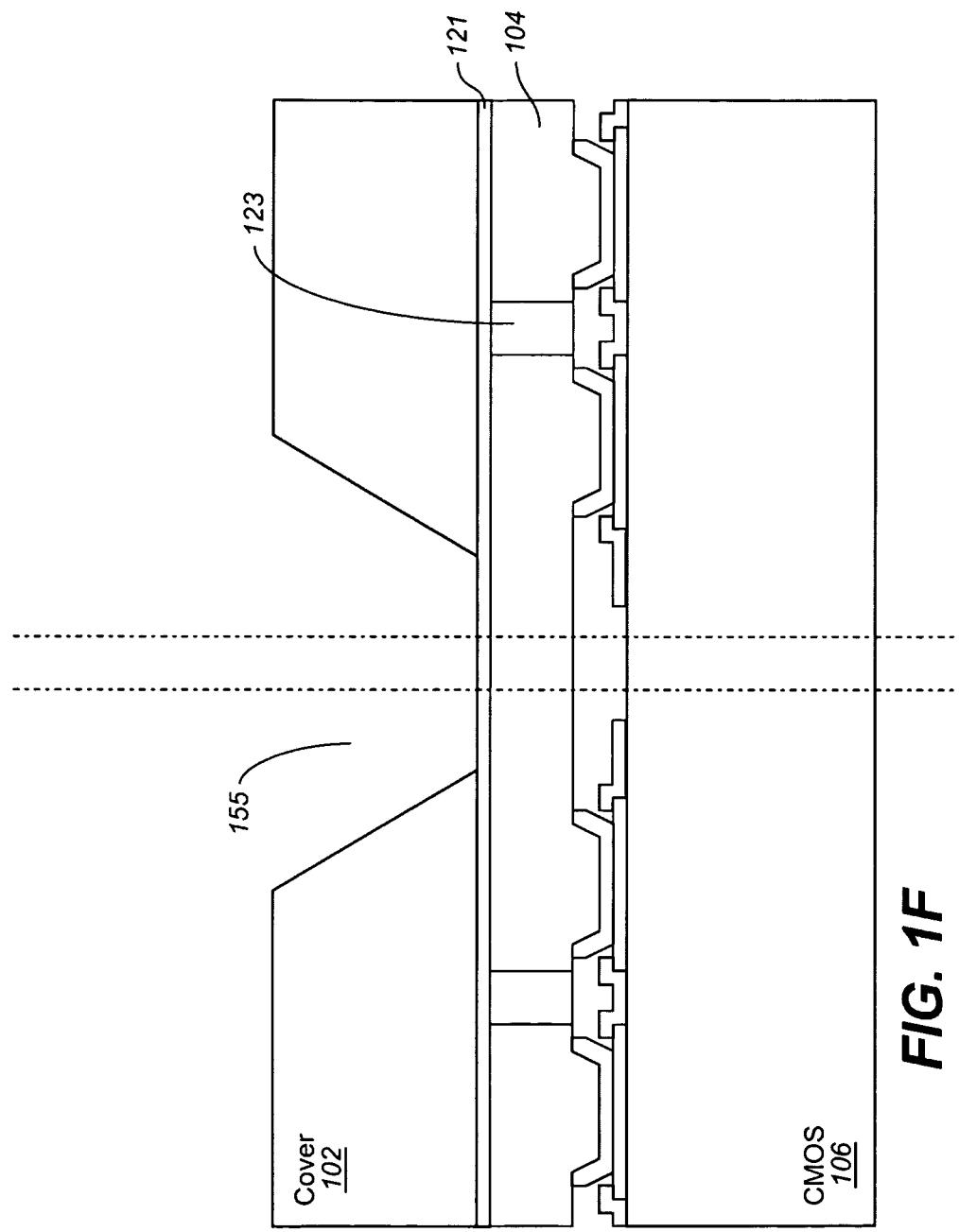
FIG. 1F depicts the DRIE etching step.

Step 3. DRIE etching. FIG. 1F depicts the DRIE etching step. First, the MEMS cover 102 is covered by photoresist which is later patterned photo lithographically to expose the area that is going to be etched. After DRIE, grooves 155 are formed over the silicon on pads 108. The DRIE stops on the oxide layer 121. At the end of the etch cycle, the oxide layer 121 is exposed on the bottom of the grooves 155. The oxide layer 121 forms membranes when there is no actuator layer underneath. The membrane geometry is defined by the cross sectional area of the isolation channels 123 in the actuator layer 104 and the bottom surface of the grooves 155.

Step 4. Aluminum deposition. FIG. 1G depicts the first aluminum deposition 302. As mentioned earlier, this step can be performed before DRIE. The deposited aluminum 302 covers everywhere. The membranes of the oxide layer 121 prevent aluminum from getting into the isolation trenches.

Figure 1H:
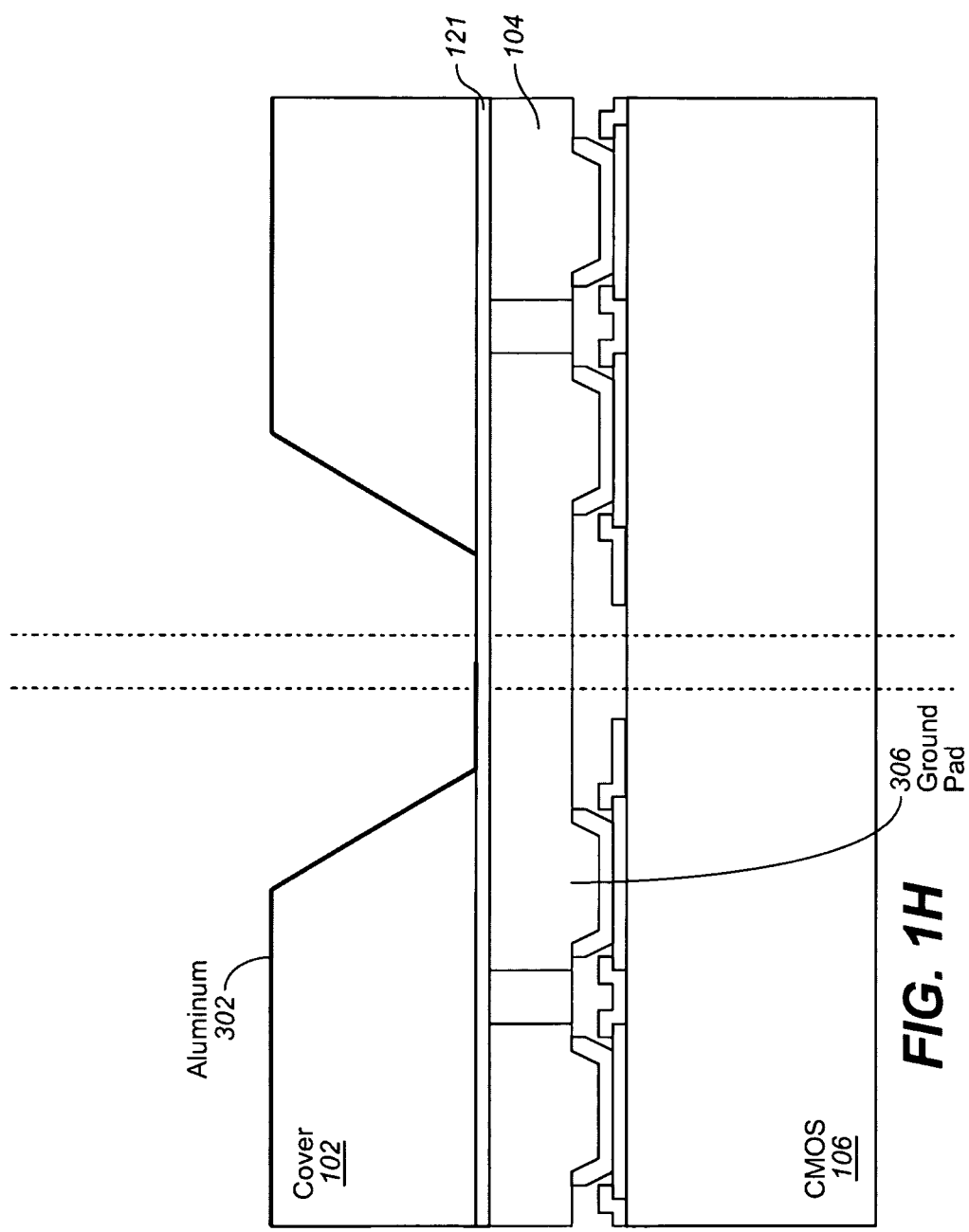
FIG. 1H shows the aluminum layer being patterned typically by conventional photolithographic techniques to remove it from the silicon pads.

Step 5. Aluminum patterning. Following the deposition, the aluminum layer 302 is patterned typically by conventional photolithographic techniques to remove it from the silicon on pads 108 (FIG. 1H). Since the wafer surface has topography, electroplated photoresist can be used to cover the aluminum surface. This photoresist can be patterned using a shadow mask in the grooves. On the ground pad 306 a small portion of the aluminum can be left. After wafer sawing, the edge of the aluminum is exposed and makes contact with a second aluminum layer which is short circuited to the ground pad 306.

Figure 1I:
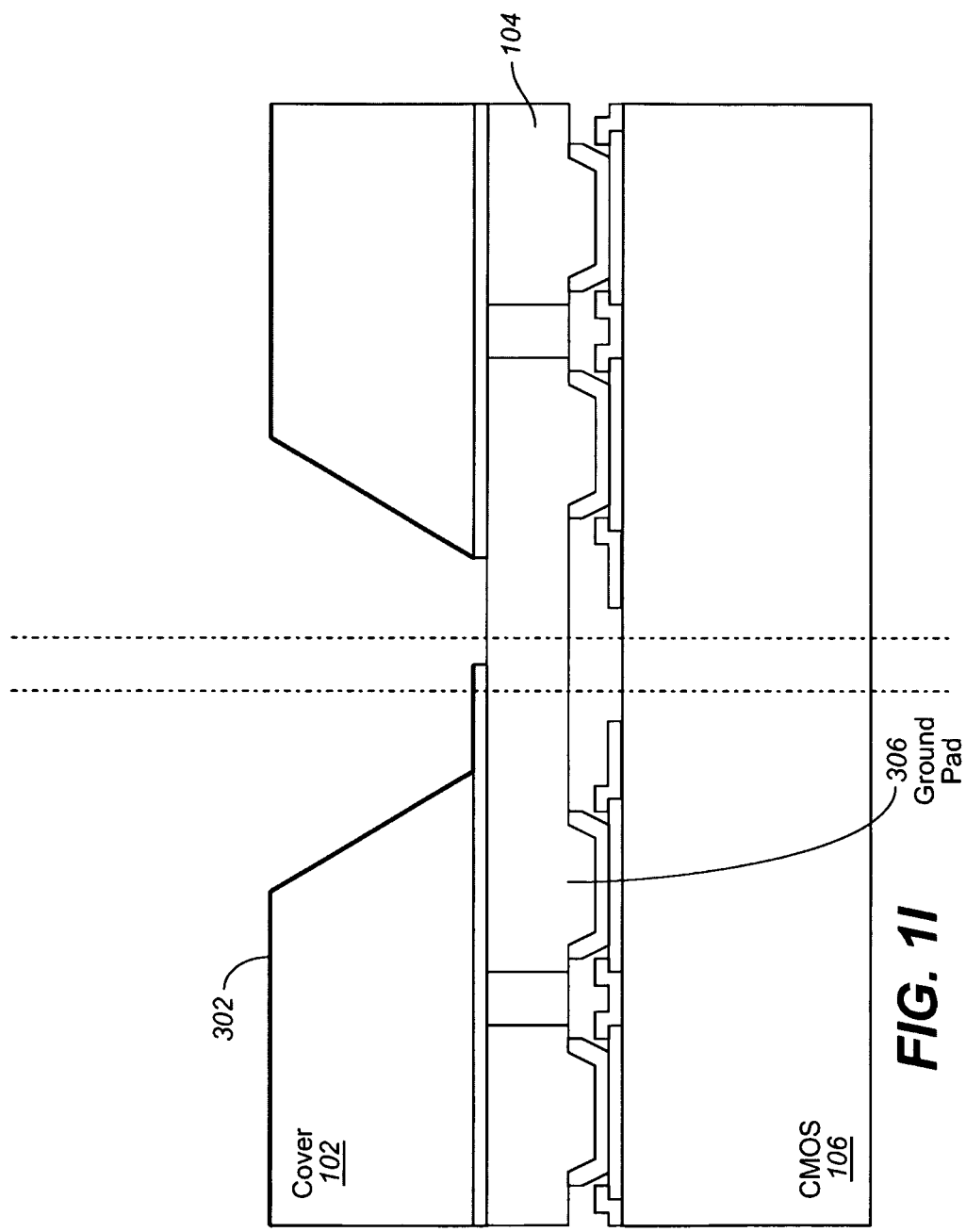
FIG. 1I shows the oxide etching step.

Step 6. Oxide etching. FIG. 1I shows the oxide etching step. The photoresist mask that was used to pattern aluminum can also be used as the oxide mask layer. Oxide on the silicon on pads 108 can be etched in an HF or a BOE solution.

FIG. 1J shows a top view after oxide etching. After oxide etching, the isolation channels 123 become accessible. The first aluminum deposition 302 covers most of the area including top and slanted surfaces. This layer 302 will be used for shielding. As shown in the Figure, a small portion of the aluminum 302 extends over the silicon on pad 108. The aluminum edge on the silicon on pad 108 will be connected to the ground pad 306 via a second aluminum deposition.

Figure 1K:
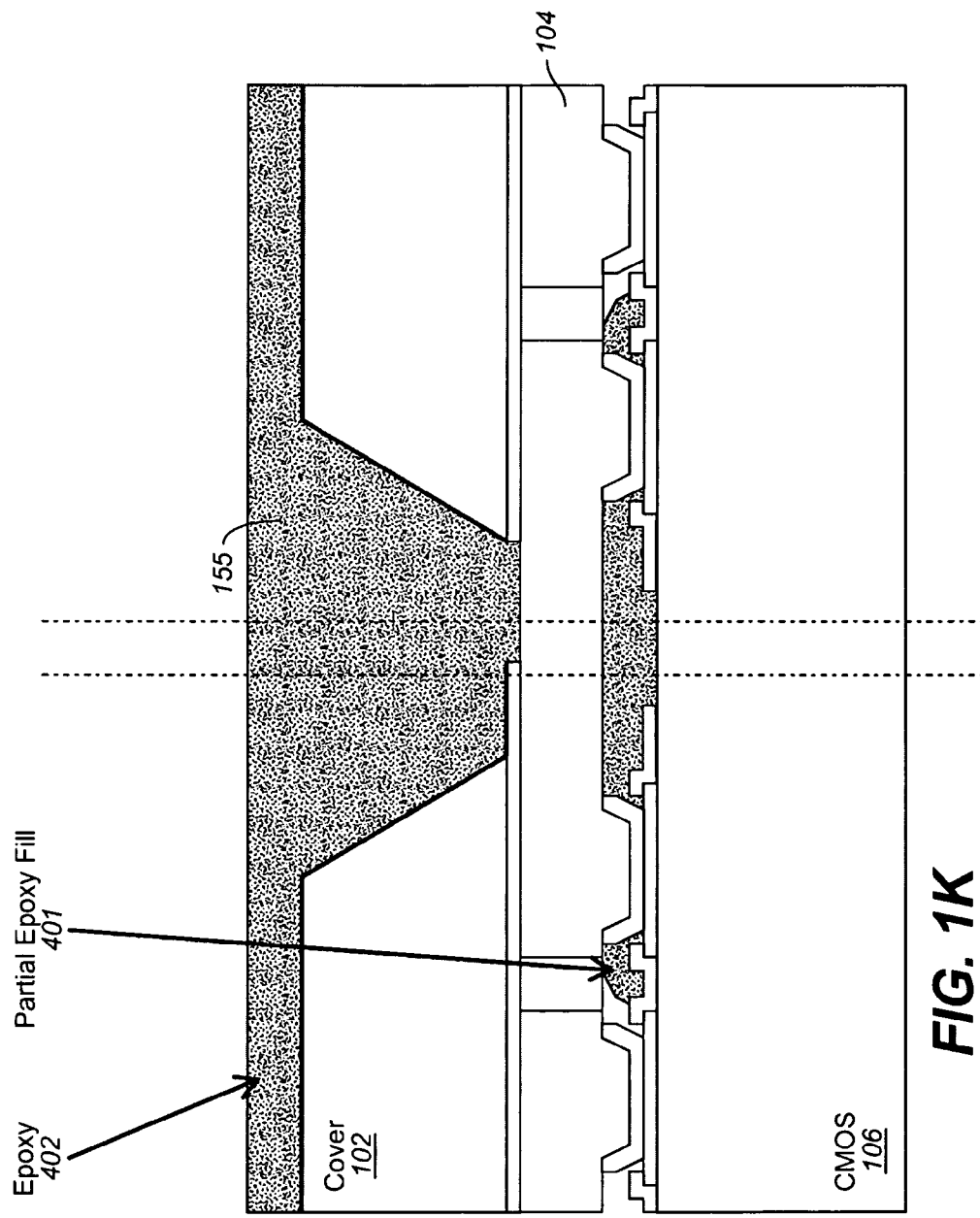
FIG. 1K shows the epoxy deposition.

Step 7. Epoxy deposition. The next step in the fabrication is the epoxy deposition 402 (FIG. 1K). The epoxy 402 can be spray coated, curtain coated, or spin coated. The epoxy 402 will fill the grooves 155 and isolation trenches within the actuator layer 104.

Step 8. Glass layer bonding. After pre-curing, a layer of glass plate 406, preferably 100 microns thick, is bonded over epoxy 402 leaving 10 to 20 micron thick epoxy 402 between the MEMS cover 102 and the glass plate 406 (FIG. 1L). Applying pressure over the glass plate 406 also helps to fill in the isolation trenches.

Figure 1M:
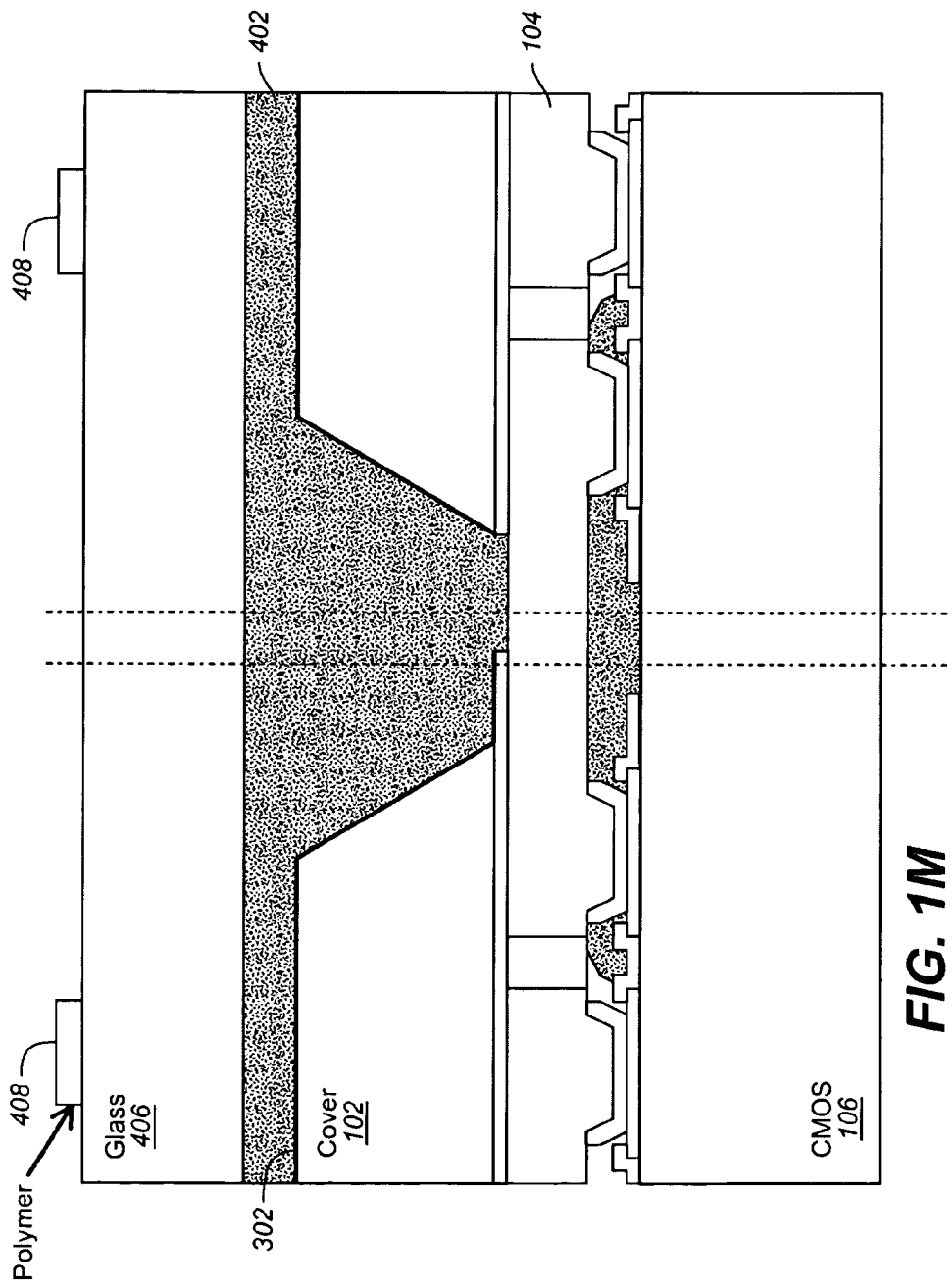
FIG. 1M shows a polymer layer being deposited and patterned leaving polymer posts on the glass plate.

Step 9. Polymer deposition and patterning. In the next step, as shown in FIG. 1M, a polymer layer is deposited and patterned leaving polymer posts 408 on the glass plate 406. Later solder balls will be placed on these polymer posts 408 whose function is to relieve a portion of the stress due to the PCB mounting.

Figure 1N:
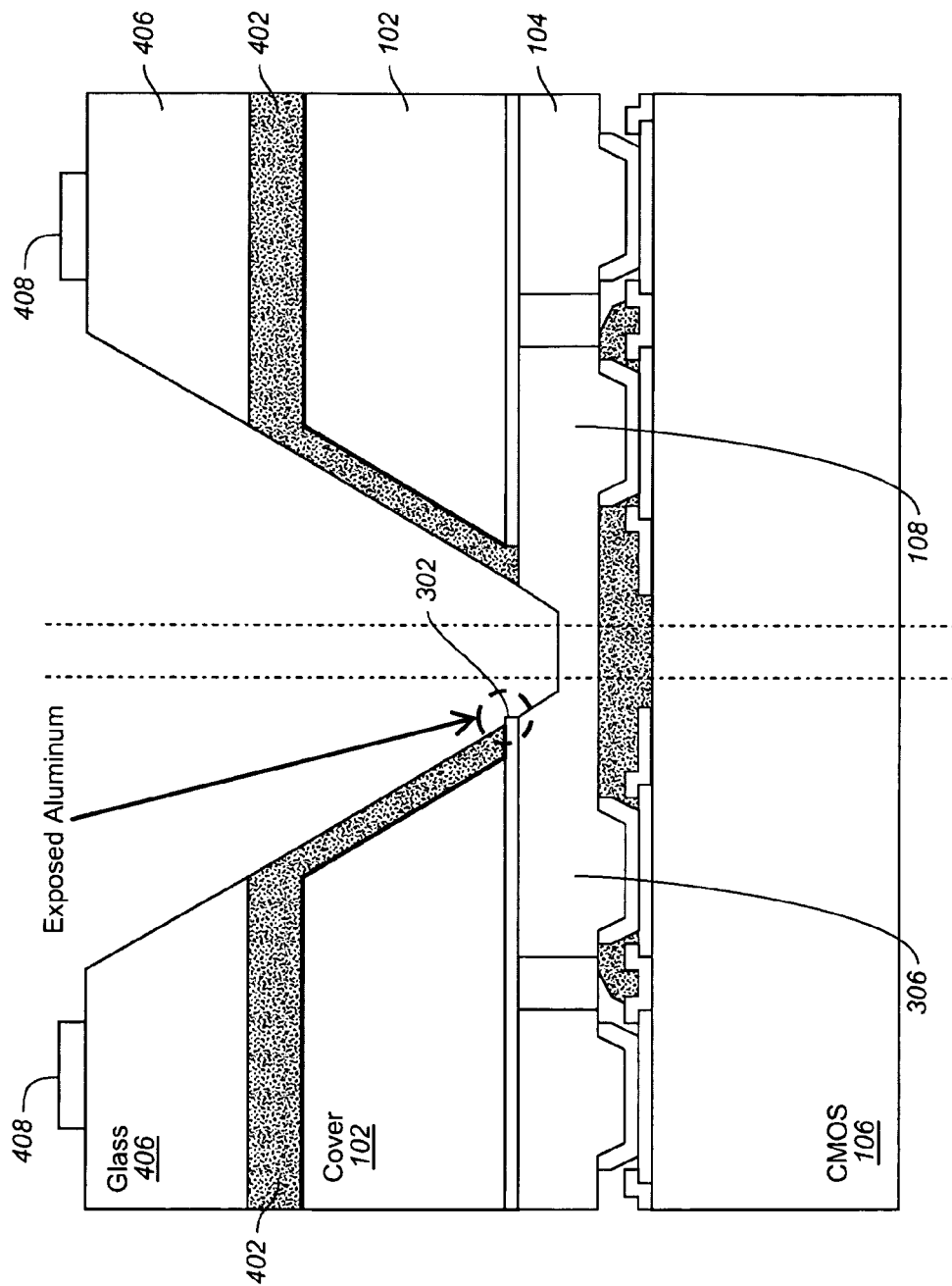
FIG. 1N shows wafer sawing that exposes the conducting silicon pads.
Figure 10:
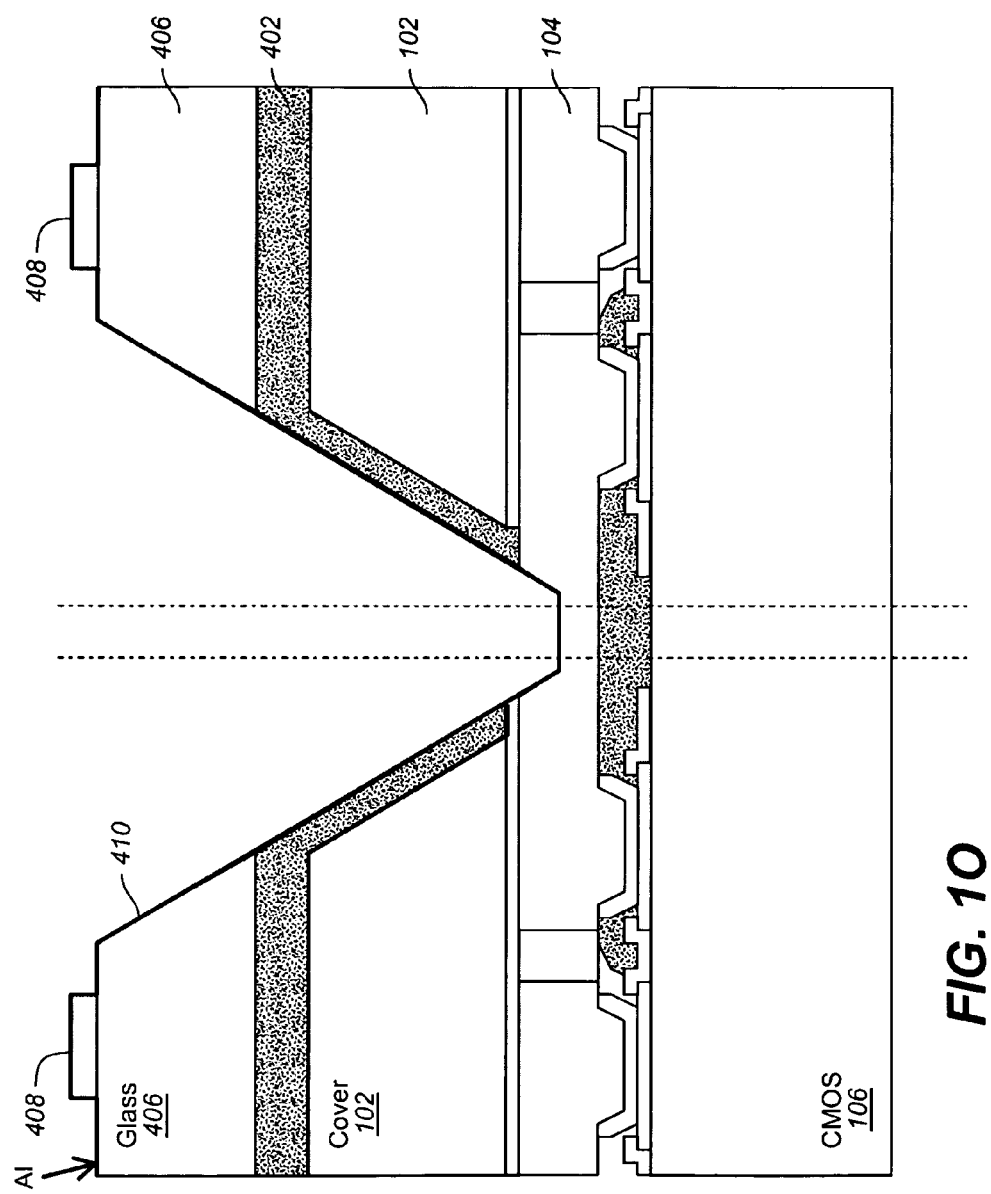

Step 10. Wafer sawing to form a notch. FIG. 1N shows wafer sawing that exposes the conducting silicon on pads 108. At this step, the edge of the first aluminum 302 also becomes accessible on the ground pad 306. The notch angle with normal is approximately 30 degrees.

Step 11. Aluminum deposition. The second aluminum deposition 410 (FIG. 1O), makes the ground connection.

Figure 1P:
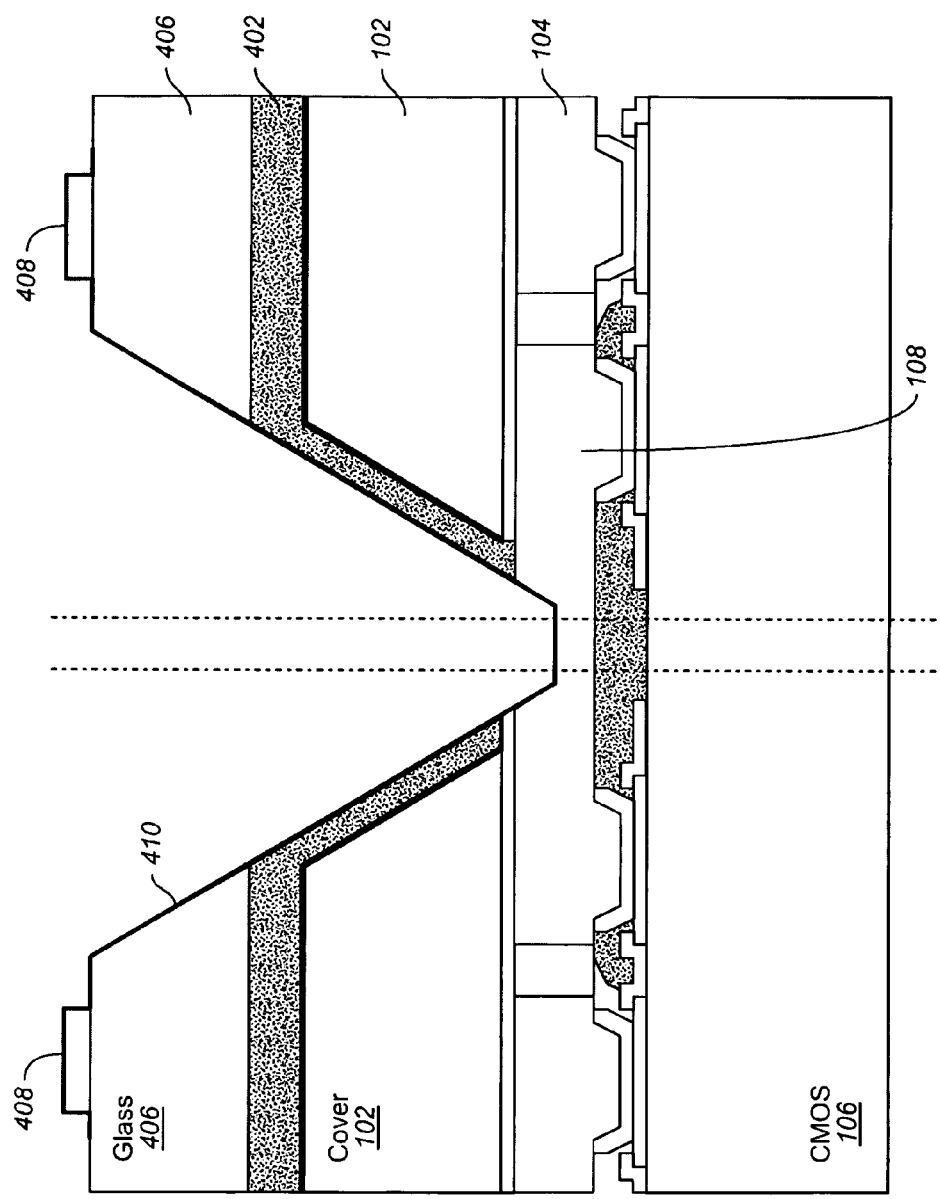
FIG. 1P shows aluminum patterning.

Step 12. Aluminum patterning. For non-ground pads, the patterned aluminum enables the connections between the solder balls and silicon on pads 108 (FIG. 1P). The aluminum layer 410 is patterned by a suitable photolithographic method, preferably by deposition of electroplated photoresist followed by shadow masking.

Figure 1Q:
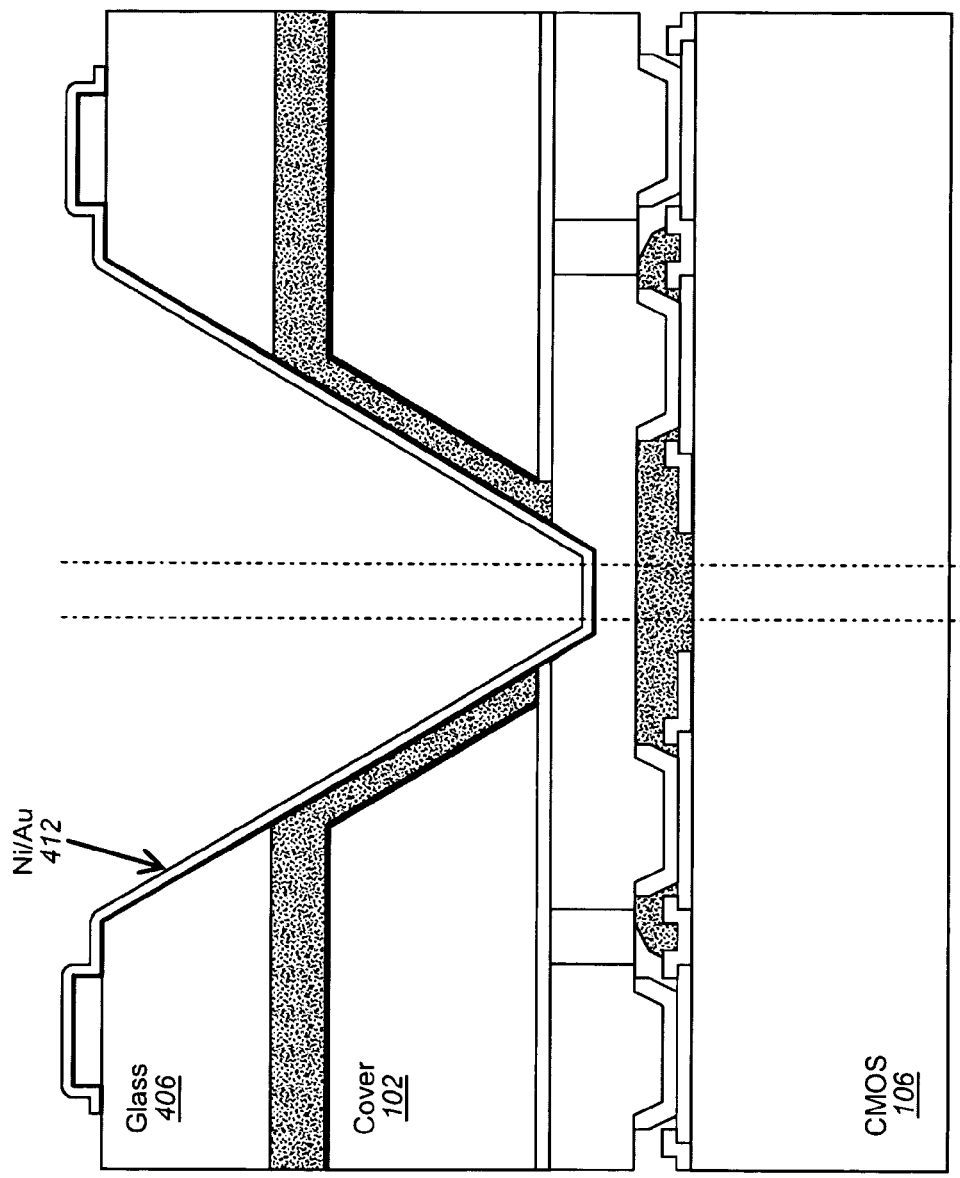
FIG. 1Q shows electroless nickel/gold deposition.

Step 13. FIG. 1Q shows electroless Nickel/Gold deposition 412. Electroless deposition of Nickel/Gold covers the aluminum traces.

Figure 1R:
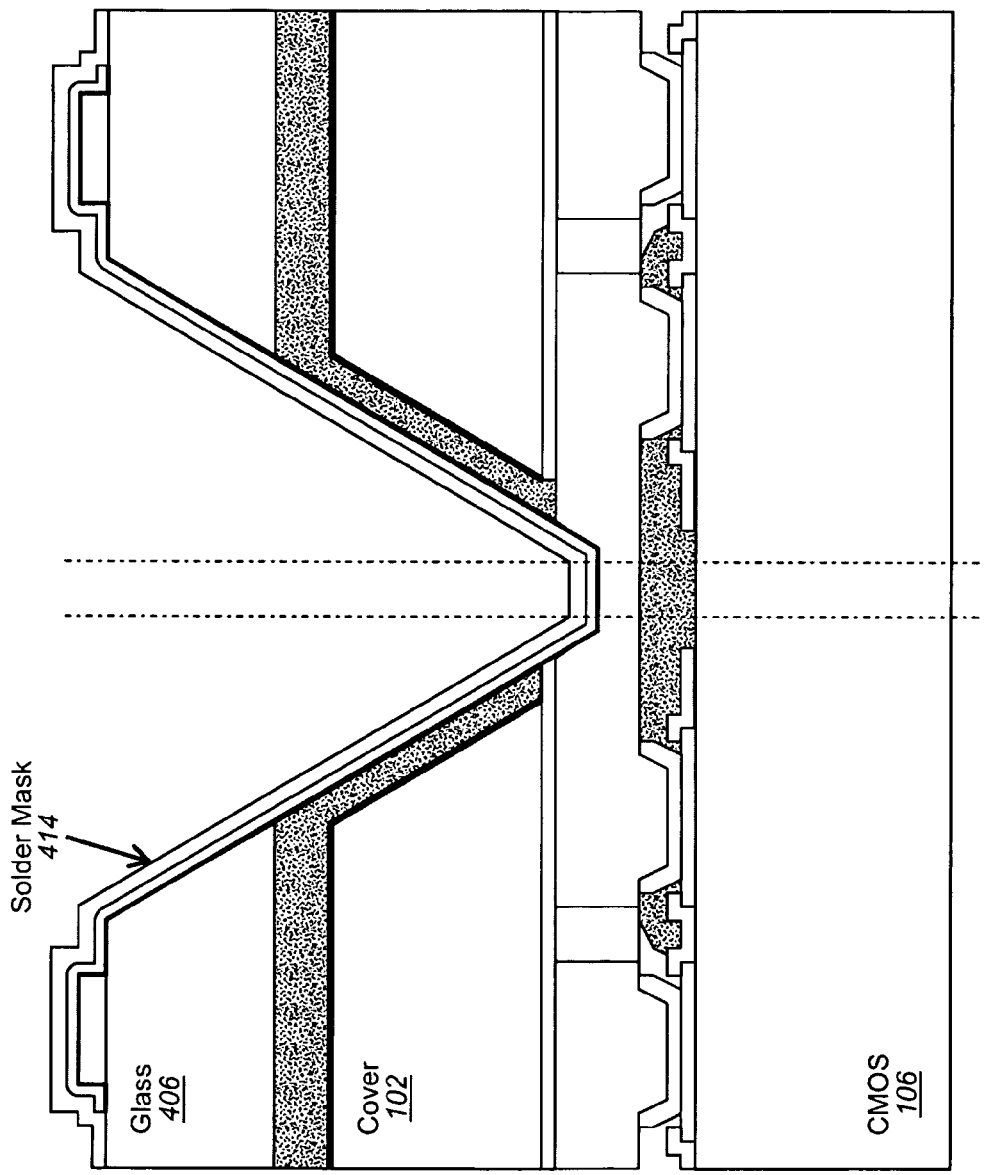
FIG. 1R shows solder mask deposition.

Step 14. FIG. 1R shows a solder mask deposition. Solder mask 414 can be deposited by any suitable method such as spraying, screen printing or spin coating.

Step 15. Solder mask patterning. Solder mask 414 is later patterned (FIG. 1S) to expose the pad openings.

Figure 1T:
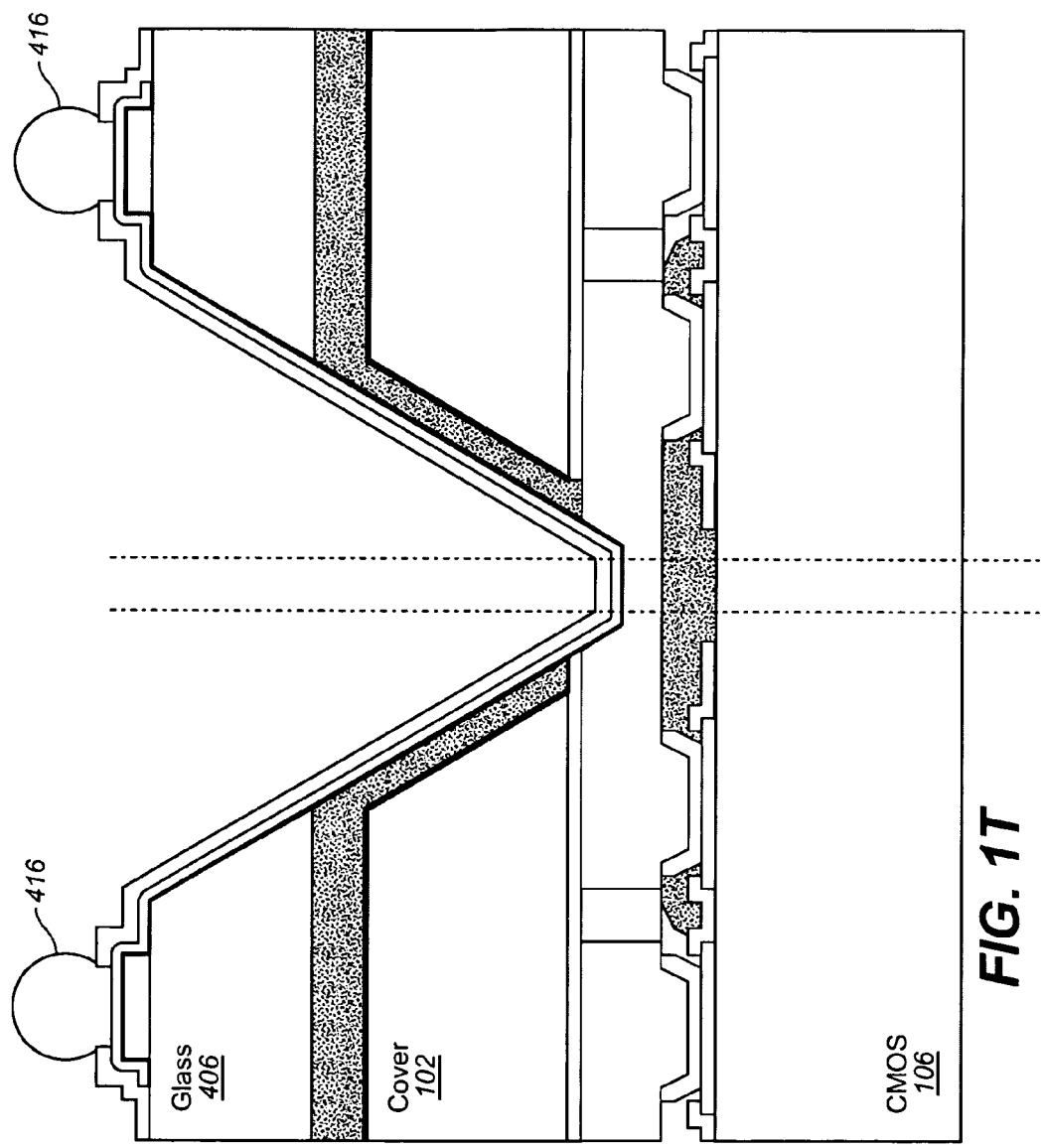
FIG. 1T shows the solder ball forming.

Step 16. FIG. 1T shows a solder ball 416 forming. Solder is deposited over the wafer. Solder flow forms the balls 416 over the pad openings.

Step 17. Wafer sawing to singulate the devices. FIG. 1U shows the top view of one of the devices.

Figure 2:
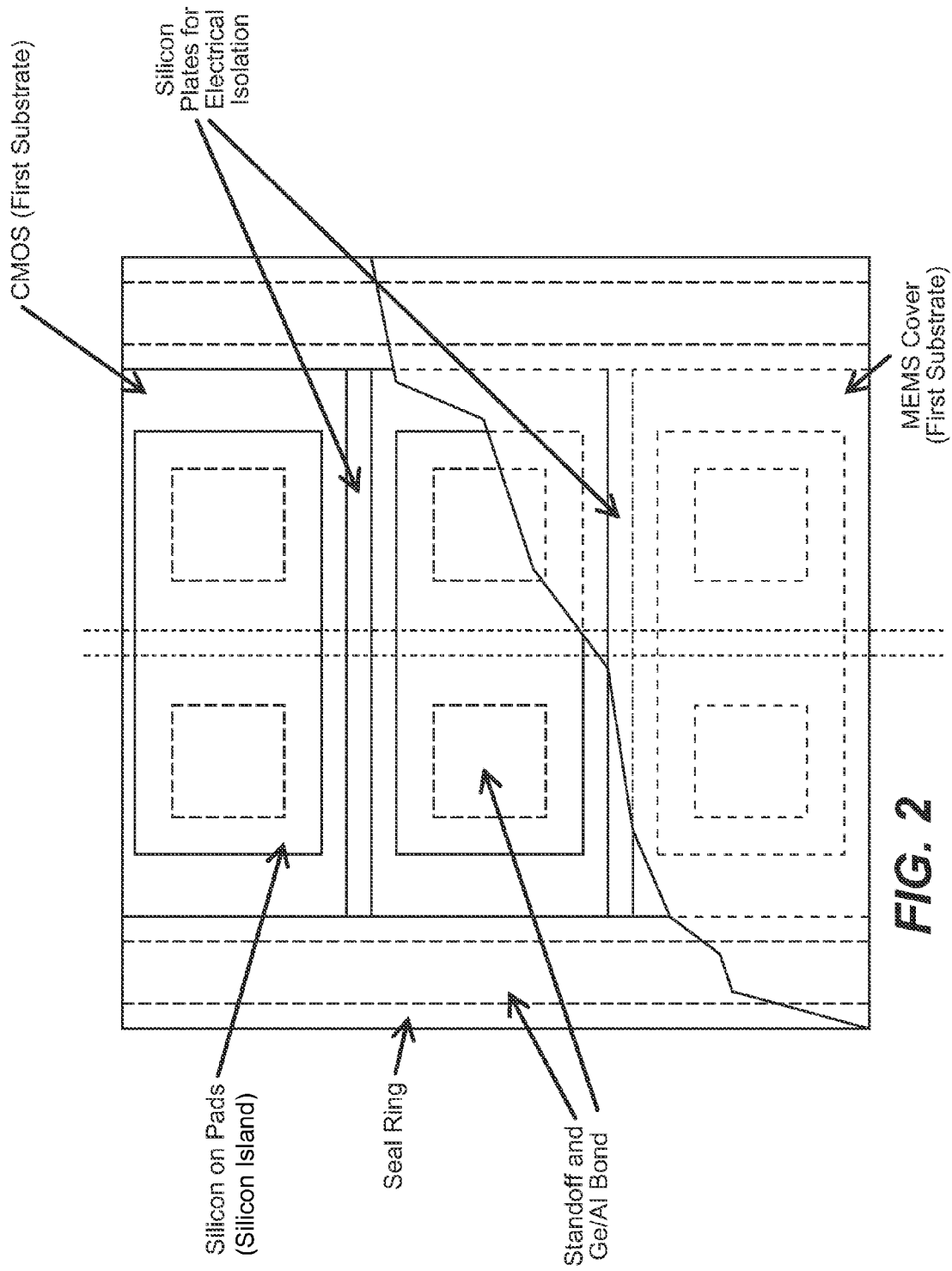
FIG. 2 shows an alternative geometry for FIG. 1E where silicon walls are placed between the silicon pads.

FIG. 2 shows another variation, in which one may place silicon pieces (or plates) extended between the silicon on pads 108.

DESCRIPTION OF VARIATIONS AND ALTERNATE EMBODIMENTS

There are variations of the structure and the fabrication process described above.

1. One variation is that the first aluminum can be deposited before the DRIE step. In this case, only the top surface of the MEMS cover will be shielded. The ground connection to this shield can be picked up along the short edge of the die. A shallow wafer sawing of epoxy reveals the edge of the aluminum shield. In this case, this wafer sawing should be performed before the second aluminum deposition. The second aluminum deposition makes a connection to the shield along the edge and routes the ground connection to the solder ball reserved for ground. Alternatively, the oxide on the ground pad can be removed by using an additional oxide mask. This allows depositing the first aluminum directly on the ground pad.

2. In another variation, one may place silicon pieces (or plates) extended between the silicon on pads 108 as shown in FIG. 2. These additional silicon pieces increase the electrical isolation between 108 the pads. The silicon island and plates are all defined during the MEMS definition using DRIE.

Features

The MEMS package has several features that may be included therein. They are listed below. The third substrate may be silicon, glass or quartz. The bond between the second substrate and the CMOS substrate may be a eutectic Al/Ge bond between Ge and on the stand offs and Al on the CMOS.

The bond between the second substrate and the CMOS substrate may be a soldering between Au/Sn on stand offs and CMOS where the pads are coated Cu, Ti/Cu, Au, TI/Au, Cr/Au, Ni, or Cr/Ni.

The third substrate may have an aluminum shield on top and on side edges to prevent EMI coupling and to reduce parasitic coupling. The third substrate may have an aluminum shield only on top to prevent EMI coupling and to reduce parasitics. The fourth substrate may have an aluminum shield on top under the solder balls and on the edge surfaces to prevent EMI coupling. There may be grounded silicon isolation between interconnects. The edge surfaces may be designed in an angle to facilitate easy fabrication and deposition of the interconnects and lithography.

The MEMS package may include aluminum, copper, doped poly silicon, or any other conducting material. The MEMS package may include an isolation layer between the fourth substrate and the third substrate made of epoxy, BCB, polyimide, or solder mask. The MEMS package may include an isolation layer between the fourth substrate and the top conducting layer made of epoxy, BCB, polyimide, or solder mask. The MEMS package may be compatible with creating hermetically seal for the MEMS. The MEMS package may be compatible with wafer scale packaging.

The third substrate may be thinned down to 150 micrometers. The fourth substrate may be nominally 100 micrometers. The MEMS package may have a cover thinned down to 150 micrometers. The first substrate may be thinned down to 250 micro-meters. The MEMS package may include conducting traces between the solder balls and the conducting bond material on the silicon interconnect standoffs.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A MEMS package comprising:
   a MEMS die containing:
   a first substrate comprising a substrate with a CMOS device, wherein the CMOS device includes a plurality of CMOS pads;
   a second substrate comprising a MEMS subassembly, bonded to the first substrate;
   a third substrate comprising a cover and bonded to the MEMS subassembly; the MEMS subassembly having generally a planar surface and an edge surfaces;
   a fourth substrate adhesively attached on top of a planar surface of the third substrate; and
   wherein the MEMS subassembly is highly doped silicon and electrically insulated from the third substrate; wherein there are silicon islands formed out of the second substrate, wherein the silicon islands are electrically isolated from the rest of the second substrate, wherein silicon islands are attached to the third substrate; wherein the silicon islands have stand offs with conducting layers; wherein the stand offs with conductive layers can form an electrical connection to the plurality of CMOS pads on the CMOS device of the first substrate; wherein solder balls are formed on a top side of the fourth substrate and are electrically connected to the plurality of CMOS pads, a layer of insulation between the third and fourth substrates; wherein a metallization attached on the edge surface of the fourth substrates and on top of the layer of insulation covering the edge of the third substrate, wherein the metallization is attached on the edge surface of the second substrate to the plurality of silicon islands, wherein the plurality of silicon islands are without insulation and one of the silicon islands makes an ohmic electrical connections to the metallization, wherein the plurality of silicon islands provide the final connection to the plurality of CMOS pads on the CMOS device.

2. The MEMS package of claim 1, wherein the third substrate is silicon, glass or quartz.

3. The MEMS package of claim 1, wherein the bond between the second substrate and the CMOS substrate is a eutectic Al/Ge bond between Ge on the stand offs and Al on the CMOS.

4. The MEMS package of claim 1, wherein the bond between the second substrate and the CMOS substrate is a soldering of Au/Sn between the second substrate stand offs and the plurality of CMOS pads, where the CMOS pads are coated Cu, Ti/Cu, Au, TI/Au, Cr/Au, Ni, or Cr/Ni.

5. The MEMS package of claim 1 wherein the third substrate having an Aluminum layer on top and on side edges to prevent EMI coupling and to reduce parasitic coupling.

6. The MEMS package of claim 1 wherein the third substrate having an Aluminum layer only on top to prevent EMI coupling and to reduce parasitics.

7. The MEMS package of claim 1, which includes an solder mask under the solder balls and an Aluminum layer; wherein the aluminum layer is under the solder mask, on top of the fourth substrate and on the edge surfaces to prevent EMI coupling.

8. The MEMS package of claim 1 wherein there is at least one silicon island connected to ground potential between the plurality of silicon islands.

9. The MEMS package of claim 1 wherein edge surfaces are designed in an angle to facilitate easy fabrication and deposition of the interconnects and lithography.

10. The MEMS package of claim 1 including aluminum, copper, doped poly silicon, or any other conducting material.

11. The MEMS package of claim 1 including an isolation layer between the fourth substrate and the third substrate, the isolation layer being made of epoxy, BCB, polyimide, or solder mask.

12. The MEMS package of claim 1 including an isolation layer between the fourth substrate and the metallization, the isolation layer being made of epoxy, BCB, polyimide, or solder mask.

13. The MEMS package of claim 1 being compatible with creating a hermetic seal for the MEMS.

14. The MEMS package of claim 1 being compatible with wafer scale packaging.

15. The MEMS package of claim 1 wherein the third substrate of claim 1 being thinned down to 150 micro-meters.

16. The MEMS package of claim 1 wherein the fourth substrate being nominally 100 micro-meters.

17. The MEMS package of claim 1 having the cover thinned down to 150 micrometers.

18. The MEMS package of claim 1 wherein the first substrate is thinned down to 250 micro-meters.

19. A MEMS package comprising:
    a first substrate comprising a substrate with a CMOS device, wherein the CMOS device includes a plurality of CMOS pads;
    a second substrate comprising a MEMS subassembly, bonded to the first substrate;
    a third substrate comprising a cap bonded to the MEMS subassembly; the MEMS subassembly having generally a planar surface and an edge surfaces; and
    a fourth substrate, adhesively attached on top of the third substrate on the planar surface; wherein the MEMS subassembly is highly doped silicon and electrically insulated from the third substrate; wherein there are silicon islands formed out of the second substrate wherein the silicon islands are electrically isolated from the rest of the second substrate, wherein the silicon islands have stand offs with conducting layers.

20. The MEMS device of claim 19, wherein the stand offs with conductive layers can form an electrical interconnection to the pads of the first substrate, on the CMOS device.

21. The MEMS device of claim 19, wherein solder balls are formed on a top side of the fourth substrate and are electrically connected to the plurality of CMOS pads, wherein a metallization attached on the edge surface of the fourth and the third substrates and on top of a layer of insulation, wherein the layer of insulation covers the edge surface along the third substrate, wherein the metallization is attached on the edge surface of the second substrate to the plurality of silicon islands, wherein the plurality of silicon islands are not covered by the insulation layer and one of the silicon islands makes an ohmic electrical connections to the metallization, wherein the plurality of silicon islands provide the final connection to the plurality of CMOS pads on the CMOS device.

* * * * *